United States Patent
Sutardja et al.

(10) Patent No.: US 7,889,752 B2
(45) Date of Patent: Feb. 15, 2011

(54) DUAL PORTED NETWORK PHYSICAL LAYER

(75) Inventors: Sehat Sutardja, Los Altos Hills, CA (US); Pierte Roo, Sunnyvale, CA (US)

(73) Assignee: Marvell International Ltd., Hamilton (BM)

(*) Notice: Subject to any disclaimer, the term of this patent is extended or adjusted under 35 U.S.C. 154(b) by 607 days.

(21) Appl. No.: 11/857,238

(22) Filed: Sep. 18, 2007

(65) Prior Publication Data

US 2008/0165794 A1  Jul. 10, 2008

Related U.S. Application Data

(63) Continuation-in-part of application No. 11/350,414, filed on Feb. 9, 2006, now Pat. No. 7,271,641, which is a continuation of application No. 11/073,806, filed on Mar. 7, 2003, now Pat. No. 7,012,458, which is a continuation of application No. 10/455,668, filed on Jun. 5, 2003, now Pat. No. 6,900,686.

(60) Provisional application No. 60/868,787, filed on Dec. 6, 2006.

(51) Int. Cl.
*H04L 12/56* (2006.01)
(52) U.S. Cl. ..................................... 370/420
(58) Field of Classification Search ................ 370/419, 370/420
See application file for complete search history.

(56) References Cited

U.S. PATENT DOCUMENTS

| | | | |
|---|---|---|---|
| 4,004,109 A | 1/1977 | Boxall | |
| 4,191,900 A | 3/1980 | Redfern et al. | |
| 4,547,683 A | 10/1985 | Bingham | |
| 5,936,469 A | 8/1999 | Alexander et al. | |
| 6,154,784 A | 11/2000 | Liu | |
| 6,163,283 A | 12/2000 | Schofield | |
| 6,236,238 B1 | 5/2001 | Tanji et al. | |
| 6,259,745 B1 | 7/2001 | Chan | |
| 6,265,856 B1 | 7/2001 | Cali' et al. | |
| 6,411,647 B1 | 6/2002 | Chan | |
| 6,665,347 B2 | 12/2003 | van Bavel et al. | |

(Continued)

FOREIGN PATENT DOCUMENTS

EP  1422878 A2  5/2004

(Continued)

OTHER PUBLICATIONS

A Front-end Circuit for Full-duplex Transmission over Coaxial Cable by Rajeevan Mahadevan; Jan. 9, 2005; 89 pages.

(Continued)

*Primary Examiner*—Ayaz R. Sheikh
*Assistant Examiner*—Blanche Wong

(57) ABSTRACT

A switching physical layer (PHY) device comprises a first termination network, a switching transmitter, and a switching receiver. The first termination network communicates with a first network connector. The switching transmitter includes first and second outputs, which communicate with the first termination network and a second termination network, respectively. The switching transmitter selectively outputs a transmit signal to a selected one of the first and second termination networks based on a control signal. The switching receiver includes first and second inputs, which communicate with the first and second termination networks, respectively. The switching receiver receives a receive signal from the selected one of the first and second termination networks.

28 Claims, 27 Drawing Sheets

U.S. PATENT DOCUMENTS

| | | |
|---|---|---|
| 6,674,382 B1 | 1/2004 | Jordan |
| 6,775,529 B1 | 8/2004 | Roo |
| 6,812,733 B1 | 11/2004 | Plasterer et al. |
| 6,867,621 B2 | 3/2005 | Mulder et al. |
| 6,900,686 B1 | 5/2005 | Roo |
| 6,972,625 B2 | 12/2005 | Nguyen et al. |
| 7,002,995 B2 * | 2/2006 | Chow et al. ............... 370/485 |
| 7,012,458 B1 | 3/2006 | Roo |
| 7,028,128 B2 | 4/2006 | Zhang et al. |
| 7,046,752 B2 | 5/2006 | Chan |
| 7,050,468 B2 | 5/2006 | Seto et al. |
| 7,093,145 B2 | 8/2006 | Werner et al. |
| 7,107,380 B1 | 9/2006 | Mohan |
| 7,113,121 B1 | 9/2006 | Sutardja et al. |
| 7,148,750 B2 | 12/2006 | Behzad et al. |
| 7,185,225 B2 | 2/2007 | Sutardja et al. |
| 7,292,596 B1 | 11/2007 | Campana et al. |
| 7,523,289 B2 * | 4/2009 | Starr et al. ............... 711/202 |
| 2003/0080800 A1 | 5/2003 | Kuttner |
| 2004/0153752 A1 | 8/2004 | Sutardja et al. |
| 2008/0031270 A1 * | 2/2008 | Tran et al. ............... 370/419 |

FOREIGN PATENT DOCUMENTS

EP      1125401 B1     6/2005

OTHER PUBLICATIONS

A 125-MHz Mixed-Signal Echo Canceller for Gigabit Ethernet on Copper Wire; Tai-Cheng Lee and Behzad Razavi, Member, IEEE; IEEE Journal of Solid-State Circuits, vol. 36, No. 3, Mar., 2001; 8 pages.

Application Note 741; Rail-to-Rail Outputs and Beyond-the-Rails Inputs: The Inside Story on Micropower Op Amps; Dallas Semiconductor Maxim; Mar. 23, 2001; 7 pages.

* cited by examiner

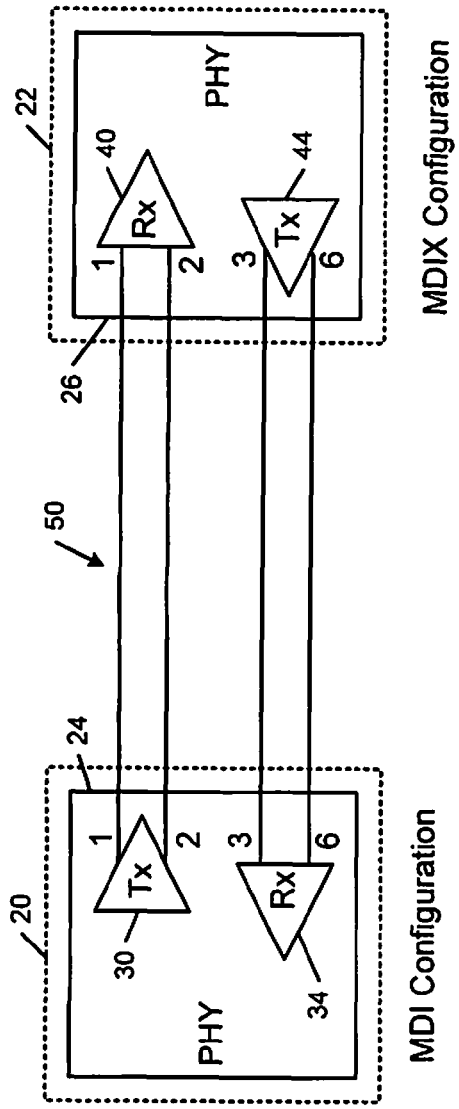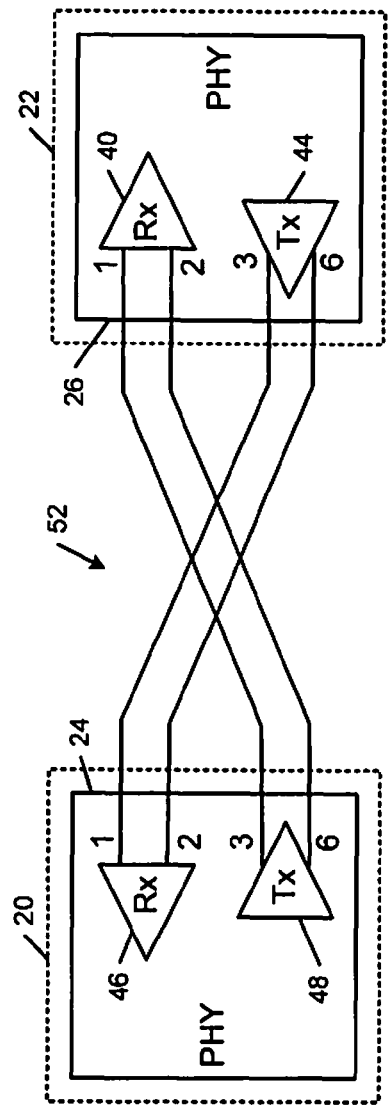
FIG. 2A
Prior Art
FIG. 2B
Prior Art

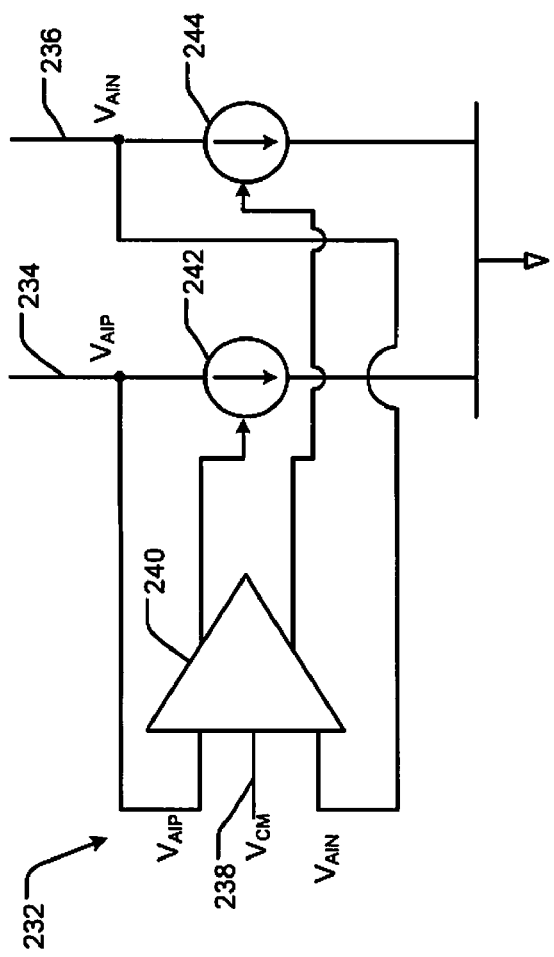
FIG. 7
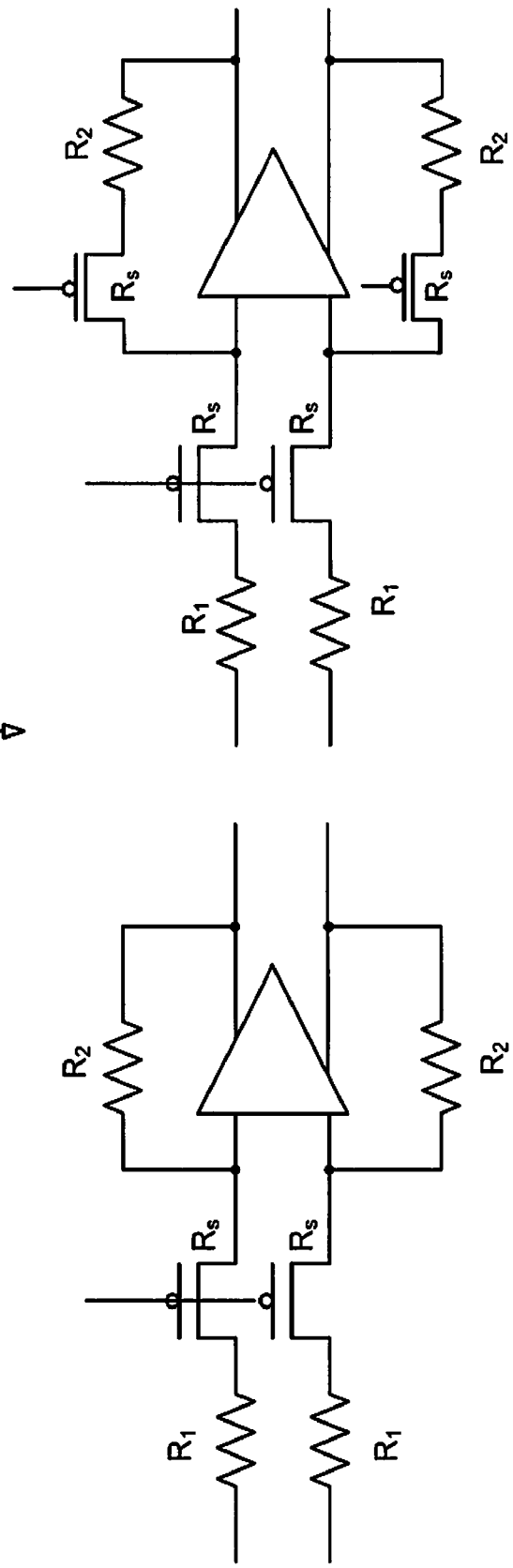
FIG. 11
FIG. 10

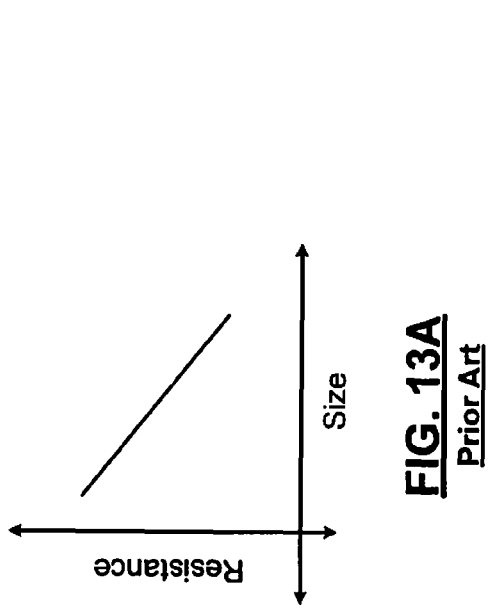
FIG. 13A
Prior Art
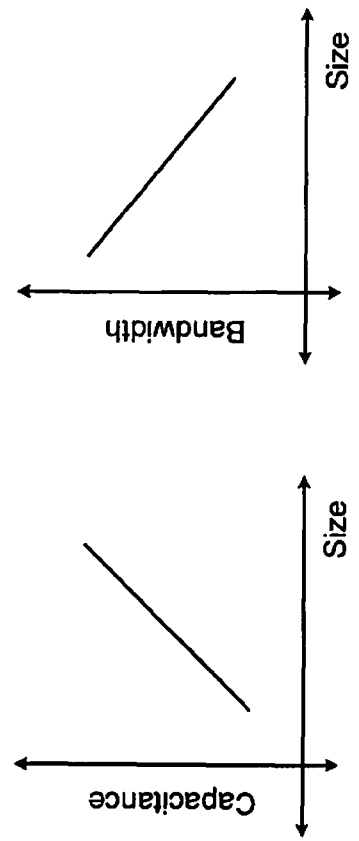
FIG. 13C
Prior Art
FIG. 13B
Prior Art
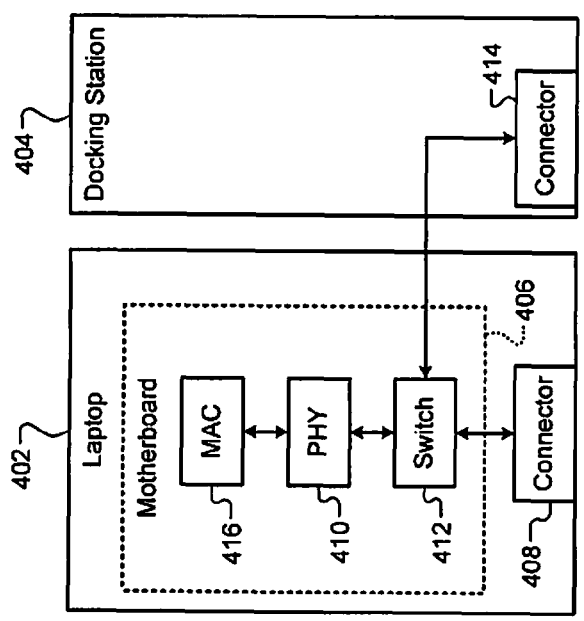
FIG. 12
Prior Art

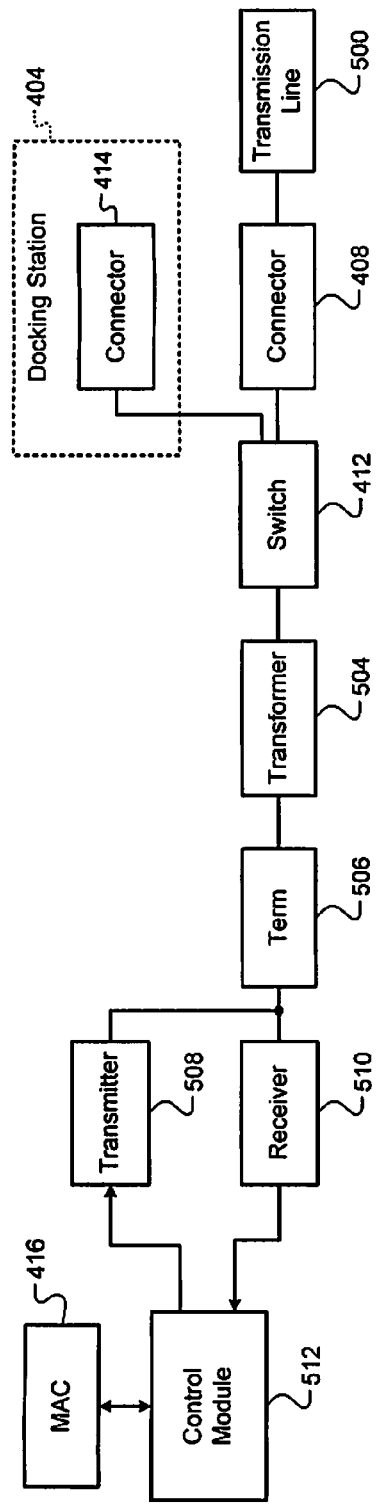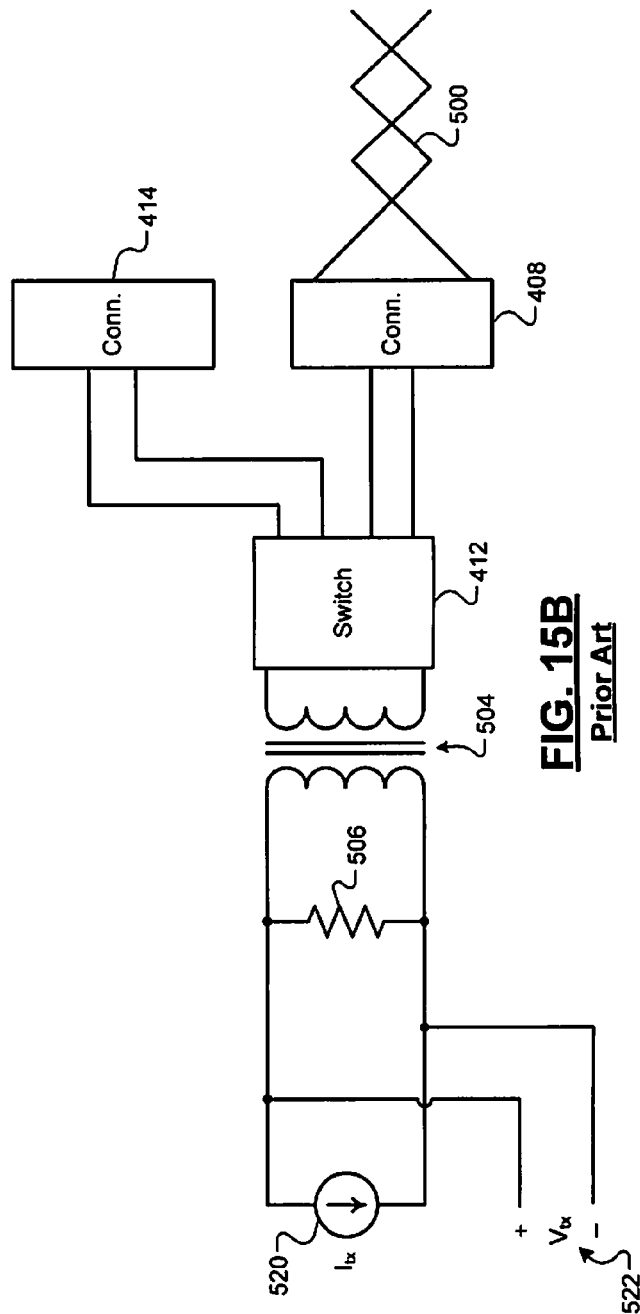
FIG. 15A Prior Art
FIG. 15B Prior Art

US 7,889,752 B2

DUAL PORTED NETWORK PHYSICAL LAYER

CROSS-REFERENCE TO RELATED APPLICATIONS

This application claims the benefit of U.S. Provisional Application No. 60/868,787, filed on Dec. 6, 2006, and is a continuation-in-part of U.S. patent application Ser. No. 11/350,414, filed on Feb. 9, 2006, which is a continuation of U.S. patent application Ser. No. 11/073,806, filed on Mar. 7, 2005, which is a continuation of U.S. patent application Ser. No. 10/455,668, filed on Jun. 5, 2003. The disclosures of the above applications are incorporated herein by reference in their entirety.

FIELD

The present disclosure relates to analog switching circuits, and more particularly to analog switching circuits for semiconductor devices, network devices, and other integrated circuits.

BACKGROUND

Many circuits selectively receive inputs from and/or provide outputs to two or more other circuits. A switching circuit that includes transistors may be used to select between the inputs and/or outputs. For example in FIGS. 1A and 1B, first and second circuits 10 and 12 are selectively connected by a switching circuit 14 to a third circuit 16. In some implementations, the first and second circuits 10 and 12 are selectively connected by transistors $Q_1$ and $Q_2$ and $Q_3$ and $Q_4$, respectively. Switching inputs $S_1$ and $\overline{S}_1$ are used to select the first circuit 10 or the second circuit 12. When $S_1$ is in a first state, the first circuit 10 is connected and the second circuit 12 is not connected. When $S_1$ is in a second state, the second circuit 12 is connected and the first circuit 10 is not connected.

In some situations, the output signal of the first and second circuits 10 and/or 12 may exceed the voltage supply and/or breakdown voltage of the transistors $Q_1$, $Q_2$, $Q_3$ and $Q_4$ that are used in the switching circuit 14. For example, a voltage supply that supplies the switching circuit 14 may provide 2.5V. The switching circuit 14 may be used to switch between first and second transmitters in an Ethernet network device. The voltage output of an exemplary transmitter in a 100BASET network may be operated with a maximum voltage of 3.5V, a minimum voltage of 1.5V, and a common mode voltage of 2.5V. The maximum voltage level of the transmitter outputs may cause operational problems such as breakdown of the transistors Q1, Q2, Q3, and Q4.

Another situation that may require analog switching includes switching between MDI and MDIX configurations in 100BASET or 10BASET network devices. Referring now to FIGS. 2A and 2B, first and second network devices 20 and 22 include physical layers (PHYs) 24 and 26, respectively, that are connected by network cables. For example, the network device 20 can be a personal computer or printer and the network device 22 can be a network switch. Each of the network devices 20 and 22 is connected by at least two pairs of twisted pair wires that are labeled 1, 2 and 3, 6 in FIGS. 2A and 2B.

When in an MDI configuration in FIG. 2A, the PHY 24 has a first pair 1, 2 that is configured as a transmitter 30 and a second pair 3, 6 that is configured as a receiver 34. When in an MDIX configuration in FIG. 2B, the PHY 24 has first pair 1, 2 that is configured as a receiver 46 and a second pair 3, 6 that is configured as a transmitter 48. When in an MDIX configuration, the PHY 26 has a first pair 1, 2 that is configured as a receiver 40 and a second pair 3, 6 that is configured as a transmitter 44. When the network devices 20 and 22 have different configurations, a standard or straight network cable 50 is used. When the network devices 20 and 22 have the same configuration, a crossover network cable 52 is used. When the incorrect network cable is employed for a particular situation (as in FIG. 2B), either the cable must be changed or the transmitter and receiver connections for one of the network devices needs to be switched.

Referring now to FIG. 12, a functional block diagram of a laptop docking system according to the prior art is presented. A laptop 402 is removably connected to a docking station 404. The laptop 402 includes a motherboard 406 and a first network connector 408. A physical layer (PHY) device 410 communicates with a switch 412 and a media access control (MAC) device 416, which are all arranged on the motherboard 406.

The PHY device 410 provides an interface to a physical medium such as coaxial cable, fiber optic cable, or twisted pair. The MAC device 416 provides an interface between the PHY device 410 and a host, such as a processor of the laptop 402. The docking station 404 includes a second network connector 414. The first and second network connectors 408 and 414 communicate with the switch 412.

The first and second network connectors 408 and 414 may include RJ-45 connectors. The switch 412 selectively connects the first network connector 408 or the second network connector 414 to the PHY device 410. When the laptop 402 is connected to the docking station 404, the switch 412 may automatically select the second network connector 414. Once the laptop 402 is removed from the docking station 404, the switch 412 may automatically select the first network connector 408.

The switch 412, however, has an inherent resistance. The resistance causes a voltage drop between the PHY device 410 and the first and second network connectors 408 and 414, which degrades performance. Incoming signals are attenuated, leading to a greater error rate in identifying received symbols. If the incoming signals are already attenuated, such as by a long twisted pair transmission line, the additional attenuation caused by the switch may cause the incoming signals to violate a minimum voltage specification.

The switch 412 causes similar attenuation problems for transmit signals. In order to decrease the resistance of the switch 412, the size of the switch 412 can be increased, as shown by a relationship illustrated in FIG. 13A. However, as the size of the switch 412 increases, the capacitance of the switch 412 also increases, as shown by a relationship illustrated in FIG. 13B.

As capacitance increases, the bandwidth of the switch 412 is limited, as shown in FIG. 13C. When the switch 412 is small enough to maintain adequate bandwidth for a protocol such as Gigabit Ethernet, it may have a resistance of approximately 5 ohms. With a termination resistance of 50 ohms, such as is typical of Ethernet, the resistance of the switch 412 causes an approximate 10% decrease in signal strength.

Referring now to FIG. 14A, a functional block diagram of a network interface according to the prior art with a single network connector is presented. A transmission line 500 communicates with the first network connector 408. The first network connector 408 communicates with a transformer 504, which couples signals from the transmission line 500 to a termination resistance 506. The termination resistance 506 communicates with a transmitter 508 and a receiver 510. A control module 512 transmits data to the transmitter 508 and receives data from the receiver 510. The control module 512 communicates with the MAC device 416.

Referring now to FIG. 14B, a functional schematic diagram of the network interface of FIG. 14A is presented. The transmission line 500 is coupled to the first network connector 408, which communicates with the transformer 504. The transformer 504 communicates with the termination resistance 506. The transmitter 508 provides a current $I_{tx}$ 520 to first and second ends of the termination resistance 506. The receiver 510 detects a voltage $V_{tx}$ 522 across the first and second ends of the termination resistance 506.

Referring now to FIG. 15A, a functional block diagram of a switched network interface according to the prior art including two network connectors is presented. The docking station 404 includes the second network connector 414. For purposes of illustration, the transmission line 500 is shown coupled to the first network connector 408. The switch 412 selectively couples one of the first and second network connectors 408 and 414 to the transformer 504.

Referring now to FIG. 15B, a functional schematic diagram of the switched network interface of FIG. 15A is presented. For purposes of illustration, the transmission line 500 is coupled to the first network connector 408. The switch 412 selectively couples one of the first and second network connectors 408 and 414 to the transformer 504. The voltage $V_{tx}$ 522 measured across the termination resistance 506 is reduced by the voltage drop in the switch 412.

Referring now to FIG. 16A, a functional block diagram of another switched network interface according to the prior art is presented. For purposes of illustration, the transmission line 500 is connected to the first network connector 408, which couples the transmission line 500 to the termination resistance 506 via the transformer 504. The termination resistance 506 communicates with the transmitter 508 and the receiver 510.

The termination resistance 506 may communicate with the transmitter 508 and the receiver 510 via a hybrid (not shown). The transmitter 508 and the receiver 510 communicate with the control module 512. The second network connector 414 communicates with a second transformer 540. The second transformer 540 communicates with a second termination resistance 542.

The second termination resistance 542 communicates with a second transmitter 544 and a second receiver 546. The second termination resistance 542 may communicate with the second transmitter 544 and the second receiver 546 via a hybrid (not shown). The second transmitter 544 and the second receiver 546 communicate with a second control module 548.

A switch 550 selectively connects the control module 512 and the second control module 548 to the MAC device 416. The docking station 404 includes the second network connector 414 and may also include the second transformer 540, the second termination resistance 542, the second transmitter 544, the second receiver 546, and the second control module 548. The expense of duplicating all these components makes this solution unattractive.

Referring now to FIG. 16B, a functional schematic diagram of the switched network interface of FIG. 16A is presented. For purposes of illustration, the transmission line 500 is coupled to the first network connector 408. The first network connector 408 communicates with the transformer 504, which in turn communicates with the termination resistance 506. The termination resistance 506 communicates with a transceiver module 560.

The transceiver module 560 includes a transmitter and a receiver, such as the transmitter 508 and the receiver 510 of FIG. 16A, and indicated by the current $I_{tx}$ 520 and the voltage $V_{tx}$ 522, respectively. The second network connector 414 communicates with the second transformer 540, which in turn communicates with the second termination resistance 542. The second termination resistance 542 communicates with a second transceiver module 562. The switch 550 selectively connects the first and second transceiver modules 560 and 562 to the MAC device 416 of FIG. 16A.

SUMMARY

A switching physical layer (PHY) device comprises a first termination network, a switching transmitter, and a switching receiver. The first termination network communicates with a first network connector. The switching transmitter includes first and second outputs, which communicate with the first termination network and a second termination network, respectively. The switching transmitter selectively outputs a transmit signal to a selected one of the first and second termination networks based on a control signal. The switching receiver includes first and second inputs, which communicate with the first and second termination networks, respectively. The switching receiver receives a receive signal from the selected one of the first and second termination networks.

In other features, the switching PHY device further comprises first and second hybrids. The first input of the switching receiver communicates with the first termination network via the first hybrid and the second input of the switching receiver communicates with the second termination network via the second hybrid. The first output of the switching transmitter communicates with the first termination network via the first hybrid and the second output of the switching transmitter communicates with the second termination network via the second hybrid.

In further features, the switching transmitter outputs a replica transmit signal based on the transmit signal to the switching receiver. The switching receiver sums the replica transmit signal with the receive signal at a first summing node. The switching PHY device further comprises an amplifier that includes an input. The switching receiver sums the replica transmit signal with a second receive signal from a second one of the first and second termination networks at a second summing node; and a switch module that connects one of the first summing node and the second summing node to the input of the amplifier based on the control signal.

In still other features, the switching transmitter comprises a first cascode transistor that selectively passes the transmit signal to the first output based on the control signal and a second cascode transistor that selectively passes the transmit signal to the second output based on the control signal. A laptop includes the switching PHY device. A system comprises the laptop and a docking station including a second network connector that communicates with the second termination network. The docking station includes the second termination network.

In other features, the laptop includes a control module that generates the control signal to select the second termination network after the laptop is connected to the docking station. The control module generates the control signal to select the first termination network after the laptop is disconnected from the docking station. An integrated circuit comprises the switching PHY device. The integrated circuit further comprises a media access control (MAC) device that communicates with the switching PHY device.

A switching physical layer (PHY) device comprises first terminating means for terminating a network signal and for communicating with a first network connector; switching transmitter means for selectively outputting a transmit signal to a selected one of the first terminating means and a second termination network based on a control signal, where the switching transmitter means includes first and second outputs that communicate with the first terminating means and the second termination network, respectively; and switching receiver means for receiving a receive signal from the selected one of the first terminating means and the second termination network. The switching receiver means includes first and second inputs that communicate with the first terminating means and the second termination network, respectively.

In other features, the switching PHY device further comprises first hybrid means for coupling the first input of the switching receiver means with the first terminating means; and second hybrid means for coupling the second input of the switching receiver means with the second termination network. The first output of the switching transmitter means communicates with the first terminating means via the first hybrid means and the second output of the switching transmitter means communicates with the second termination network via the second hybrid means.

In further features, the switching transmitter means outputs a replica transmit signal based on the transmit signal to the switching receiver means. The switching receiver means sums the replica transmit signal with the receive signal at a first summing node. The switching PHY device further comprises amplifying means for amplifying an input. The switching receiver means sums the replica transmit signal with a second receive signal from a second one of the first terminating means and the second termination network at a second summing node; and switching means for connecting one of the first summing node and the second summing node to the input of the amplifying means based on the control signal.

In still other features, the switching transmitter means comprises first cascode switching means for selectively passing the transmit signal to the first output based on the control signal; and second cascode switching means for selectively passing the transmit signal to the second output based on the control signal. A laptop includes the switching PHY device. A system comprises the laptop and docking means for receiving the laptop. The docking means includes a second network connector that communicates with the second termination network. The docking means includes the second termination network.

In other features, the laptop includes control means for generating the control signal to select the second termination network after the laptop is connected to the docking means. The control means generates the control signal to select the first terminating means after the laptop is disconnected from the docking means. An integrated circuit comprises the switching PHY device. The integrated circuit further comprises media access control (MAC) means for communicating with the switching PHY device.

A switching physical layer (PHY) device comprises a first termination network, a switch module, and a receiver. The first termination network communicates with a first network connector. The switch module includes a terminal that communicates with the first termination network and a second termination network, and selectively connects a selected one of the first and second termination networks to the terminal based on a control signal. The receiver receives a receive signal from the terminal of the switch module.

In other features, the switching PHY device further comprises a hybrid interposed between the receiver and the terminal of the switch module; and a transmitter that outputs a transmit signal to the terminal of the switch module via the hybrid. The switching PHY device further comprises a first hybrid interposed between the switch module and the first termination network; a second hybrid interposed between the switch module and the second termination network; a second switch module that includes a second terminal, that communicates with the first and second termination networks via the first and second hybrids, respectively, and that connects the selected one of the first and second termination networks to the second terminal; and a transmitter that outputs a transmit signal to the second terminal of the second switch module.

In further features, the switching PHY device further comprises a transmitter that outputs a replica of a transmit signal to the receiver. The transmitter outputs the transmit signal to the terminal of the switch module. The switching PHY device further comprises a second switch module that includes a second terminal, that communicates with the first termination network and the second termination network, and that connects the selected one of the first and second termination networks to the second terminal. The transmitter outputs the transmit signal to the second terminal of the second switch module. The receiver subtracts the replica of the transmit signal from the receive signal. A laptop includes the switching PHY device.

In still other features, a system comprises the laptop and a docking station including a second network connector that communicates with the second termination network. The docking station includes the second termination network. The laptop includes a control module that generates the control signal to select the second termination network after the laptop is connected to the docking station. The control module generates the control signal to select the first termination network after the laptop is disconnected from the docking station. An integrated circuit comprises the switching PHY device. The integrated circuit further comprises a media access control (MAC) device that communicates with the switching PHY device.

A switching physical layer (PHY) device comprises first terminating means for terminating a network signal and for communicating with a first network connector; switching means for selectively connecting a selected one of the first terminating means and a second termination network to a terminal of the switching means based on a control signal; and receiving means for receiving a receive signal from the terminal of the switching means.

In other features, the switching PHY device further comprises hybrid means for coupling the receiving means with the terminal of the switching means; and transmitting means for outputting a transmit signal to the terminal of the switching means via the hybrid means. The switching PHY device further comprises first hybrid means for coupling the switching means with the first terminating means; second hybrid means for coupling the switching means with the second termination network; second switching means for connecting the selected one of the first terminating means and the second termination network to a second terminal of the second switching means.

In further features, the second switching means communicates with the first terminating means and the second termination network via the first and second hybrid means, respectively; and transmitting means for outputting a transmit signal to the second terminal of the second switching means. The switching PHY device further comprises transmitting means for outputting a replica of a transmit signal to the receiving means. The transmitting means outputs the transmit signal to the terminal of the switching means.

In still other features, the switching PHY device further comprises second switching means for connecting the selected one of the first terminating means and the second termination network to a second terminal. The transmitting means outputs the transmit signal to the second terminal of the second switching means. The receiving means subtracts the replica of the transmit signal from the receive signal. A laptop includes the switching PHY device. A system comprises the laptop and docking means for receiving the laptop. The docking means includes a second network connector that communicates with the second termination network.

In other features, the docking means includes the second termination network. The laptop includes control means for generating the control signal to select the second termination network after the laptop is connected to the docking means. The control means generates the control signal to select the first terminating means after the laptop is disconnected from the docking means. An integrated circuit comprises the switching PHY device. The integrated circuit further comprises media access control (MAC) means for communicating with the switching PHY device.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 2A is a functional block diagram of a first network device in an MDI configuration and a second network device in a MDIX configuration according to the prior art;

FIG. 2B is a functional block diagram of the first network device in the MDIX configuration and the second network device in the MDIX configuration according to the prior art;

FIG. 7 is an electrical schematic and functional block diagram of a common mode feedback (CMFB) circuit for the switching circuit of FIG. 6;

FIG. 10 is a simplified partial electrical schematic of FIG. 8;

FIG. 11 is a simplified partial electrical schematic of FIG. 9;

FIG. 12 is a functional block diagram of a laptop docking system according to the prior art;

FIG. 13A is a graph of switch resistance versus size;

FIG. 13B is a graph of switch capacitance versus size;

FIG. 13C is a graph of switch bandwidth versus size;

FIG. 15A is a functional block diagram of a switched network interface according to the prior art with two network connectors;

FIG. 15B is a functional schematic diagram of the switched network interface of FIG. 15A;

DETAILED DESCRIPTION OF THE PREFERRED EMBODIMENTS

Figure 1C:
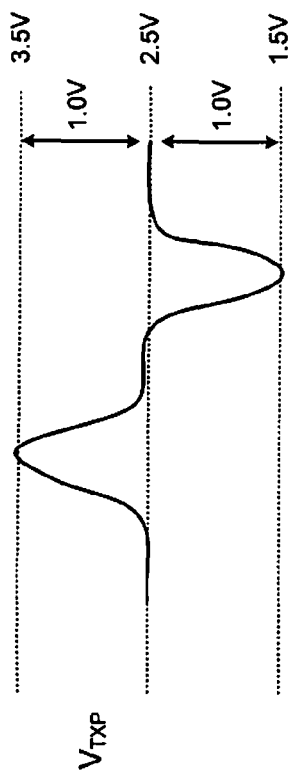
FIG. 1C illustrates an exemplary voltage output of the first and second circuits in FIGS. 1A and 1B that is switched by the switching circuit.
Figure 1A:
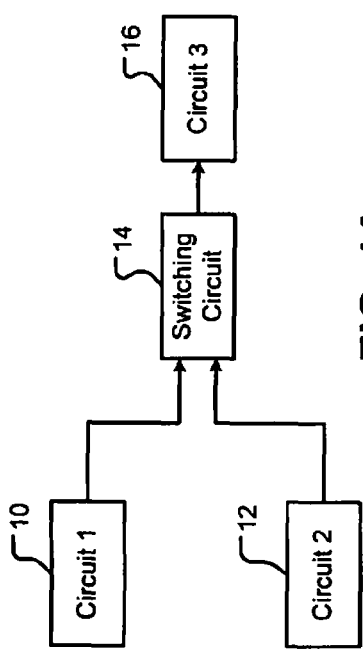
FIGS. 1A and 1B are functional block diagrams of a switching circuit according to the prior art.
Figure 1B:
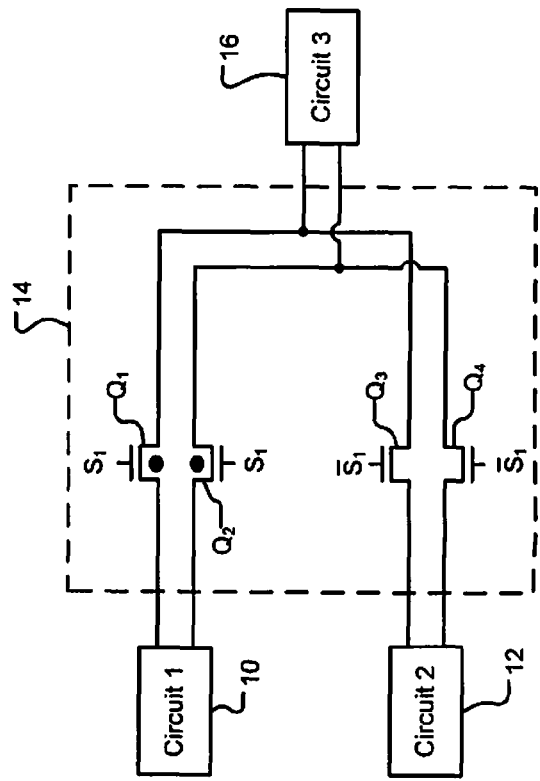

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

As used herein, the term module refers to an Application Specific Integrated Circuit (ASIC), an electronic circuit, a processor (shared, dedicated, or group) and memory that execute one or more software or firmware programs, a combinational logic circuit, and/or other suitable components that provide the described functionality.

Figure 3:
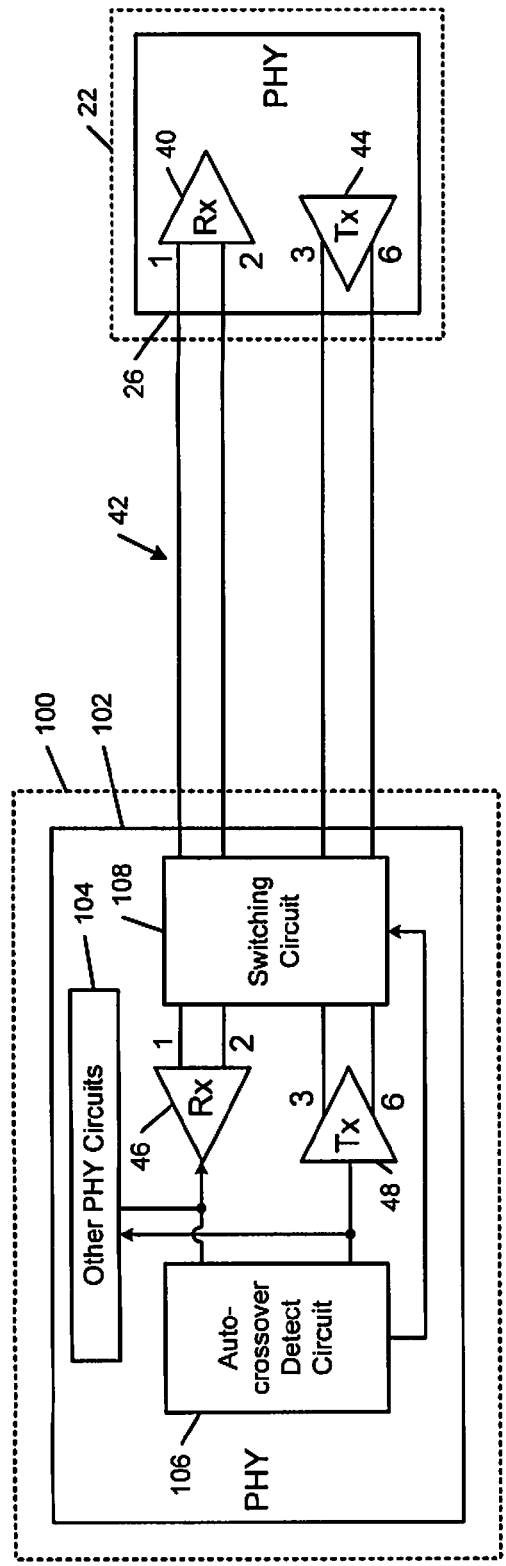
FIG. 3 illustrates a network device including an autocrossover circuit and a switching circuit according to the present disclosure.
Figure 4:
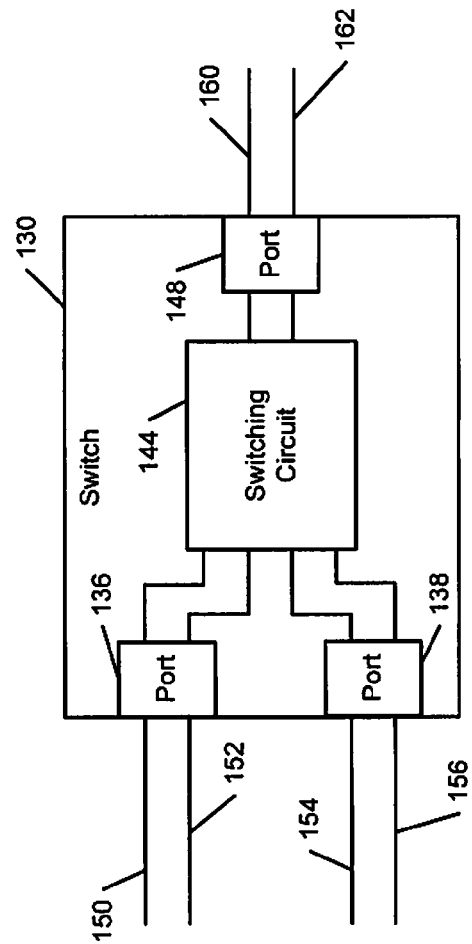
FIG. 4 is a functional block diagram of a multi-port switch including a switching circuit according to the present disclosure.

FIGS. 3, 4, and 5 illustrate several exemplary but not limiting uses of the analog switching circuit according to the present disclosure. Skilled artisans will appreciate that the analog switching circuit can be used in other environments than those depicted. FIGS. 6-10 illustrate the analog switching circuit in further detail.

Referring now to FIG. 3, a network device 100 includes a physical layer 102 with various physical layer circuits 104. An autocrossover circuit 106 communicates with the receiver 46, the transmitter 48, and an analog switching circuit 108 according to the present disclosure, which will be described more fully below. The autocrossover circuit 106 may also communicate with the physical layer circuits 104. The autocrossover circuit 106 automatically detects when the incorrect cable type is being used and generates a change configuration signal that is output to the analog switching circuit 108. Additional details relating to the autocrossover circuit 106 can be found in commonly assigned U.S. patent application Ser. No. 10/106,720, filed Mar. 26, 2002, which is hereby incorporated by reference in its entirety.

Referring now to FIG. 4, a functional block diagram of a multi-port switch 130 includes first and second ports 136 and 138. The ports 136 and 138 are selectively coupled by an analog switching circuit 144 according to the present disclosure to a third port 148. Each port 136, 138 and 148 includes first and second conductors 150 and 152, 154 and 156 and 160 and 162, respectively. The analog switching circuit 144 selectively switches the conductors 150 and 152 or 154 and 156 to the conductors 160 and 162.

Figure 5A:
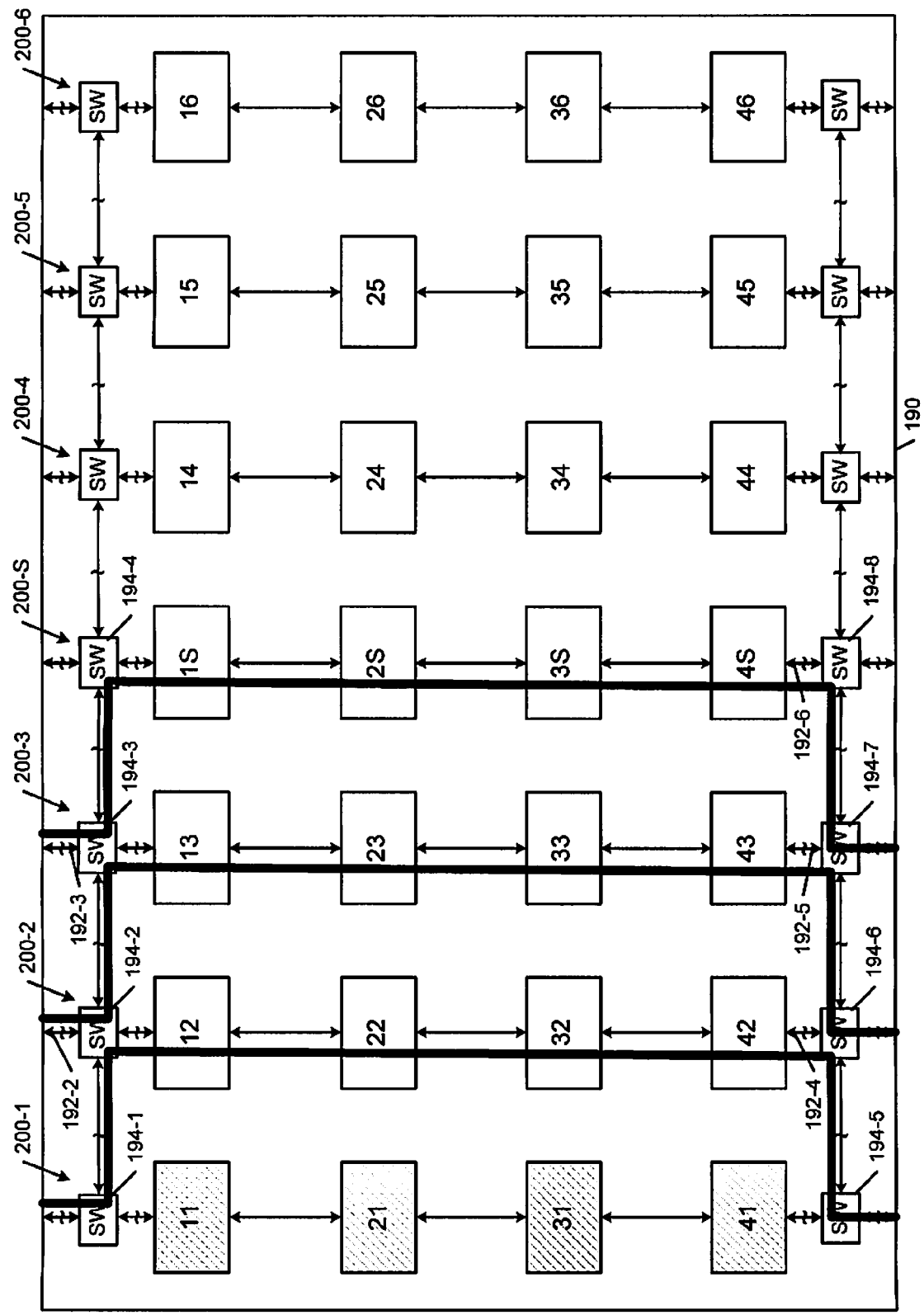
FIGS. 5A and 5B are functional block diagrams of a self-repairing semiconductor including a switching circuit according to the present disclosure.
Figure 5B:
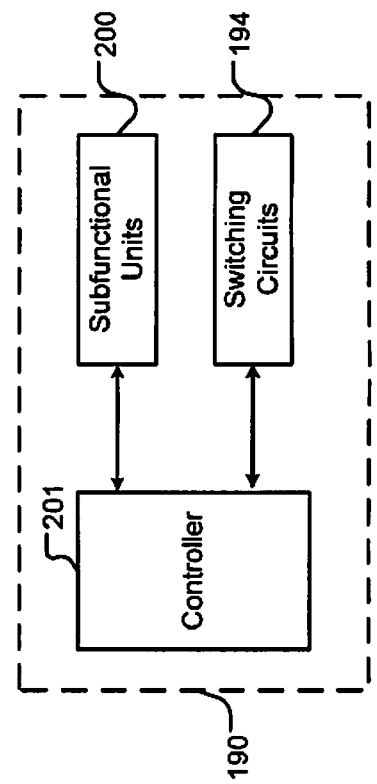

Referring now to FIGS. 5A and 5B, a self-reparable semiconductor 190 includes M generally independent functional units 200-1, 200-2, . . . , and 200-M (collectively referred to as functional units 200) that perform the same high level function. Self-reparable semiconductors are shown in commonly assigned U.S. patent application Ser. No. 10/358,709, filed Feb. 5, 2003, which is hereby incorporated by reference in its entirety. Each functional unit 200 includes the same N sub-functional units. In this example, N=4 and M=5. For example, the functional unit 200-1 includes sub-functional units 11, 21, 31, . . . , and 41. The functional unit 200-2 includes sub-functional units 12, 22, 32, . . . , and 42. The functional unit 200-6 includes sub-functional units 16, 26, 36, . . . , and 46.

The sub-functional units in a row perform the same lower level function. Typically, there are no connections between the functional units other than ground and power. There are, however, connections between the sub-functional units in a functional unit. The connections may be one-way or two-way and may include one or more connecting wires.

For example, four or eight Gigabit physical layer devices may be fabricated on the semiconductor. The physical layer device includes a first sub-functional unit that performs physical coding sub-layer (PCS), Flow Control Token (FCT), and Decision Feedback Sequence Estimation (DFSE) functions. A second sub-functional unit implements a finite impulse response (FIR) filter function. A third sub-functional unit performs echo and near end crosstalk (NEXT) functions. Fourth and fifth sub-functional units implement digital and analog front end (AFE) functions, respectively. As can be appreciated, the functional units can be separated into other sub-functional units. If the yield for each individual functional unit is 90%, then the yield for the semiconductor with x identical functional units is $(0.9)^x$. For example, if a semiconductor includes eight functional units each having a yield of 90%, the yield of the semiconductor is 43%, which is not an acceptable yield.

Referring again to FIG. 5A, a spare functional unit 200-S is fabricated on a semiconductor 190 in addition to the functional units 200-1, 200-2, . . . , and 200-6. In addition, switching circuits 194 according to the present disclosure are located at inputs and outputs of one of more of the sub-functional units. In the exemplary embodiment illustrated in FIG. 5A, the spare functional unit 200-S is located between the functional units 200. As can be appreciated, however, the spare functional unit 200-S can be located in any position on the semiconductor 190. For example, the spare functional unit 200-S can be located to the left or right of any of the functional units 200.

The switching circuits 194 and the spare functional unit 200-S allow the semiconductor 190 to replace one non-operable functional unit 200-1, 200-2, 200-3, 200-4, 200-5 or 200-6. In the example in FIG. 5A, the spare functional unit 200-S allows any number of sub-functional units in one functional unit to fail. By allowing the replacement of non-operable functional units, the yield of the semiconductor 190 is significantly improved. If one or any combination of the sub-functional units 11, 21, 31, and/or 41 in the functional unit 200-1 fail (as shown by cross-hatched shading), the analog switching circuits 194 are reconfigured to replace the non-operable sub-functional units 11, 21, 31, and 41 with the sub-functional units in the spare functional unit 200-S. In FIG. 5B, a controller 201 communicates with the functional units 200 and the switching circuits 194. The controller 201 may perform diagnostics to identify when a functional unit is not operating correctly. The controller 201 replaces the identified functional unit using the switching circuits 194.

For example, if the sub-functional unit 11 is non-operable, the inputs 192-1, 192-2, and 192-3 to the sub-functional units 11, 12, and 13 are shifted one functional unit to the right by switches 94-1, 94-2, 94-3, and 94-4. The outputs 92-4, 92-5, and 92-6 of the sub-functional units 42, 43, and 4S are shifted one functional unit to the left by switches 94-5, 94-6, 94-7, and 94-8.

After reconfiguration, the first functional unit 200-1 includes sub-functional units 12, 22, 32, and 42. The second functional unit 200-2 includes sub-functional units 13, 23, 33, and 43. The third functional unit 200-3 includes sub-functional units 1S, 2S, 3S, and 4S. The fourth functional unit 200-4 includes sub-functional units 14, 24, 34, and 44. The fifth functional unit 200-5 includes sub-functional units 15, 25, 35, and 45. The sixth functional unit 200-6 includes sub-functional units 16, 26, 36, and 46. This exemplary embodiment allows replacement on a functional unit basis only. However, additional switches can be used between sub-functional units to switch out one or more individual sub-functional units as described more fully in commonly assigned U.S. patent application Ser. No. 10/358,709, filed Feb. 5, 2003.

Figure 6:
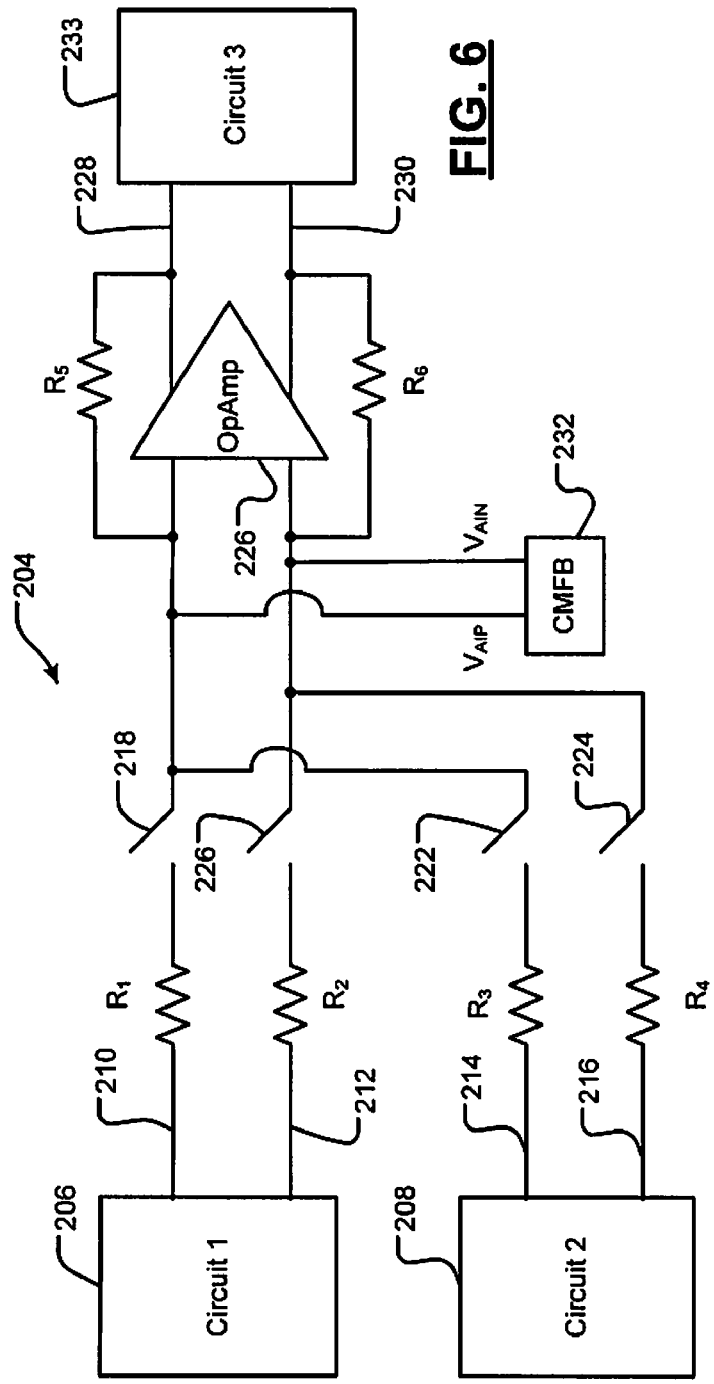
FIG. 6 is an electrical schematic and functional block diagram of an exemplary switching circuit according to the present disclosure.

Referring now to FIG. 6, an electrical schematic of an exemplary analog switching circuit 204 according to the present disclosure is shown. A first and second pair differential signals 210, 212 and 214, 216 are output by first and second circuits 206 and 208, respectively, to one end of resistors $R_1$, $R_2$, $R_3$ and $R_4$. The first and second differential signals have first and second common mode voltages, and maximum and minimum voltages. Opposite ends of the resistors $R_1$, $R_2$, $R_3$ and $R_4$ are connected to switches 218, 220, 222, and 224. The switches 218, 220, 222, and 224 selectively output either the first pair of signals 210, 212 or the second pair of input signals 214, 216 to inputs of an operational amplifier 226. The operational amplifier 226 includes feedback resistors $R_5$ and $R_6$, which are connected between inputs and outputs of the operational amplifier 226.

The operational amplifier 226 outputs a pair of output signals 228, 230 to a third circuit 233. When switches 218 and 220 are closed, switches 222 and 224 are open and the first pair of input signals 210, 212 is output to the operational amplifier 226. When switches 218 and 220 are open, switches 222 and 224 are closed and the second pair of input signals 214, 216 is output to the operational amplifier 226. A common mode feedback (CMFB) circuit 232 is connected to the inputs of the operational amplifier 226 to maintain a substantially fixed common mode voltage input that is lower than the first and second common mode voltages.

Referring now to FIG. 7, one exemplary implementation of the CMFB circuit 232 for the switching circuit 194 is shown. Referring back to FIG. 1C, an example of the input signals 210, 212 and 214, 216 is shown. The voltage level of the input signals may vary, or "swing," as high as 3.5 volts or as low as 1.5 volts and have a common mode voltage of 2.5V. The supply voltage of the transistors in the switching circuit 14 may only be around 2.5 volts or less. If the voltage level swings as high as 3.5 volts, the voltage level may exceed the breakdown voltage of the transistors in the switching device 14 and cause breakdown or other problems.

As shown in FIG. 7, voltage signals 234, 236 ($V_{AIP}$, $V_{AIN}$) and a constant common mode voltage 238 are input to an amplifier 240. The amplifier outputs adjust first and second controllable current sources 242 and 244. The current outputs of the current sources 242 and 244 adjust the voltage signals $V_{AIP}$ and $V_{AIN}$ to maintain the common mode voltage of the operational amplifier 226. The common mode voltage is limited to a common mode voltage that is less than the first and second common mode voltages. In the example set forth above, the common mode voltage of the operational amplifier is limited to 1.5V.

Figure 8:
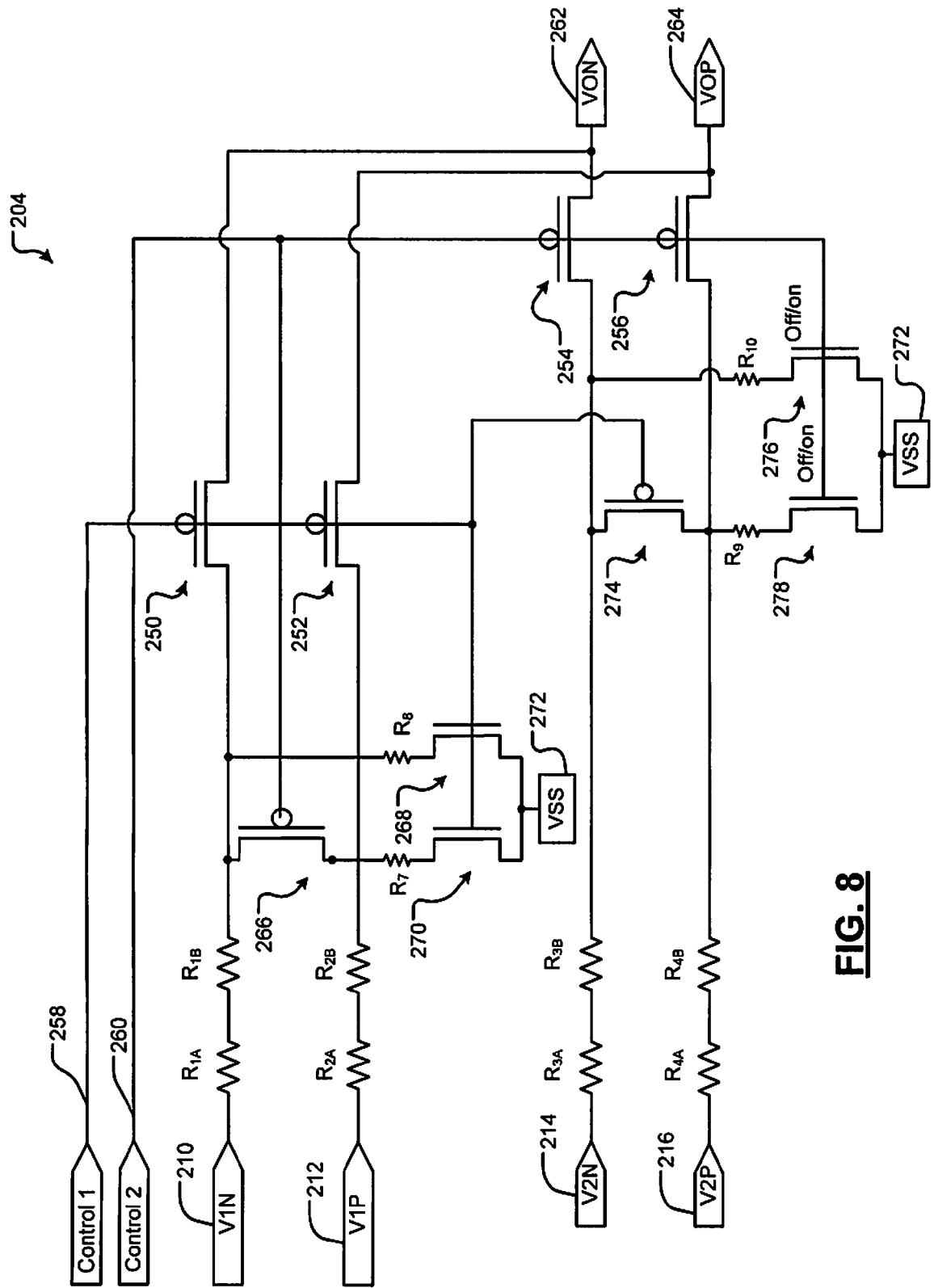
FIG. 8 is an electrical schematic of one exemplary implementation of the switching circuit according to the present disclosure.

Referring now to FIG. 8, an electrical schematic of one exemplary implementation of the analog switching circuit 204 according to the present disclosure is shown. The first pair of input signals 210, 212 is output via resistors $R_{1A}$ and $R_{1B}$ and $R_{2A}$ and $R_{2B}$ to a first pair of transistors 250, 252, respectively. The second pair of input signals 214, 216 is output via resistors $R_{3A}$ and $R_{3B}$ and $R_{4A}$ and $R_{4B}$ to a second pair of transistors 254, 256, respectively. A pair of switching signals 258, 260 controls the states of the first and second pairs of transistors 250, 252 and 254, 256 (and other transistors described below). In the preferred embodiment, the transistors 250, 252 and 254, 256 are PMOS transistors. However, other suitable transistors, such as NMOS transistors, may also be used. If the transistors 250, 252 are on, the transistors 254, 256 are off. Either the first pair of input signals 210, 212 or the second pair of input signals 224, 226 are output as output signals.

A transistor 266 and transistors 268 and 270 short the inputs 210 and 212 and bias the inputs 210 and 212 via resistors $R_7$ and $R_8$ to $V_{ss}$, respectively, to prevent drift, distortion and/or diode turn on. Transistors 274, 276 an 278 and resistors $R_9$ and $R_{10}$ perform a similar function for inputs 214 and 216.

Figure 9:
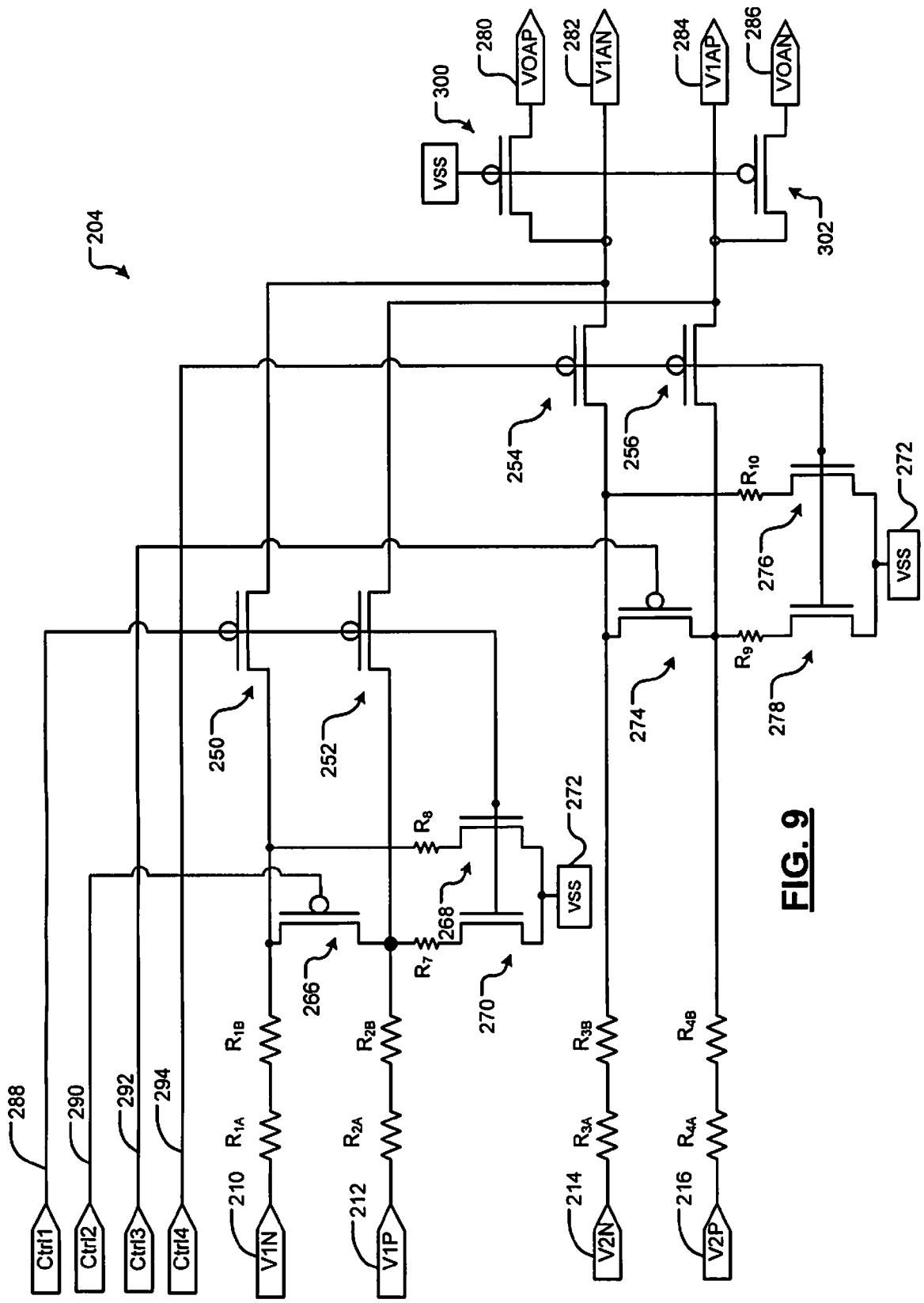
FIG. 9 is an electrical schematic of another exemplary implementation of the switching circuit according to the present disclosure.
Figure 14A:
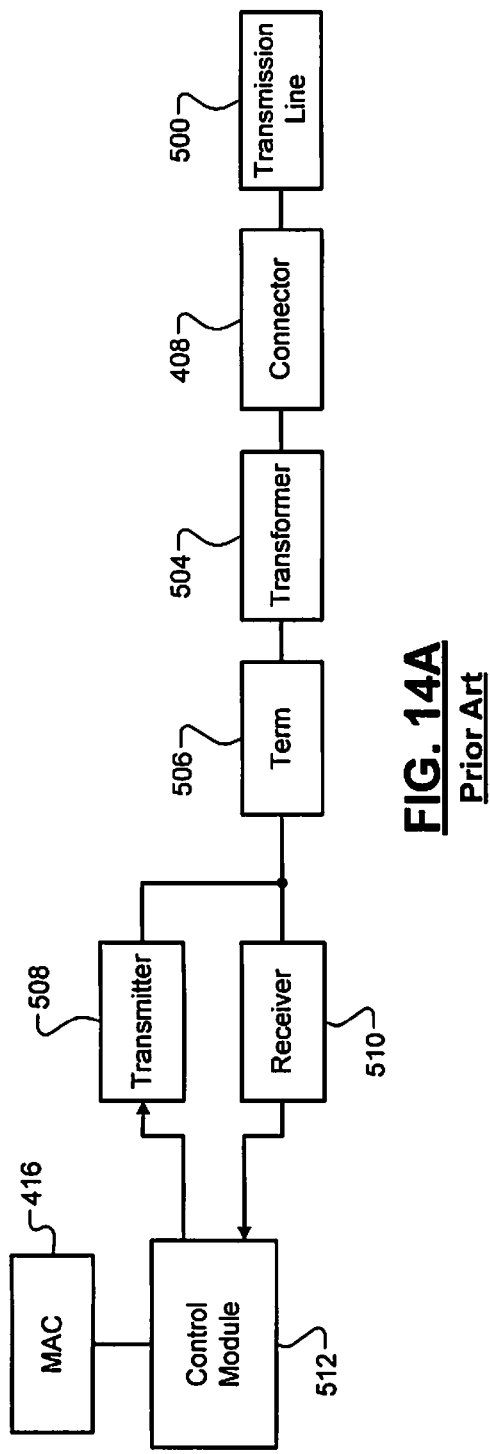
FIG. 14A is a functional block diagram of a network interface according to the prior art with a single network connector.
Figure 14B:
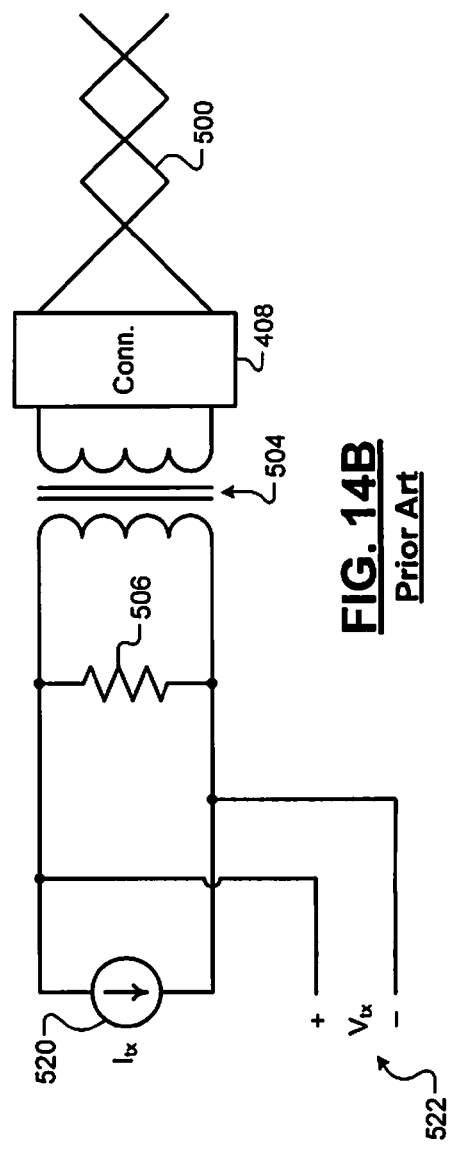
FIG. 14B is a functional schematic diagram of the network interface of FIG. 14A.

Referring now to FIG. 9, an electrical schematic of another exemplary implementation of the switching circuit according to the present disclosure is shown. The switching circuit in FIG. 9 is similar to FIG. 8. However, additional switches 300 and 302 are added to eliminate the gain error caused by switching resistance, as will be described below.

Referring now to FIGS. 10 and 11, gain error that is introduced by the switching resistance for the circuits in FIGS. 8 and 9 is illustrated. In FIG. 10, the gain is defined as follows:

$$A(\text{gain}) = -\frac{R_2}{R_1 + R_s}$$

$$\text{if } R_s = 0.1 R_1,$$

$$\text{then } A = -\frac{R_2}{1.1 R_1} = -0.909 \frac{R_2}{R_1}$$

Where $R_s$ is the switching resistance. This gain error may be acceptable when used in some receivers, such as 10BASET and 100BASE-T receivers. However, this gain error may not be acceptable in other implementations such as Gigabit or 802.3ab compliant receivers.

In FIG. 11, the additional switches are added eliminate the gain error. The gain is defined as follows:

$$A = -\frac{R_2 + R_s}{R_1 + R_s}$$

$$\text{if } R_s = 0.1 R_1, \text{ and } R_2 = R_1,$$

$$\text{then } A = -\frac{1.1 R_2}{1.1 R_1} = -\frac{R_2}{R_1}$$

Therefore, the additional switches 300 and 302 eliminate the gain error.

Figure 17:
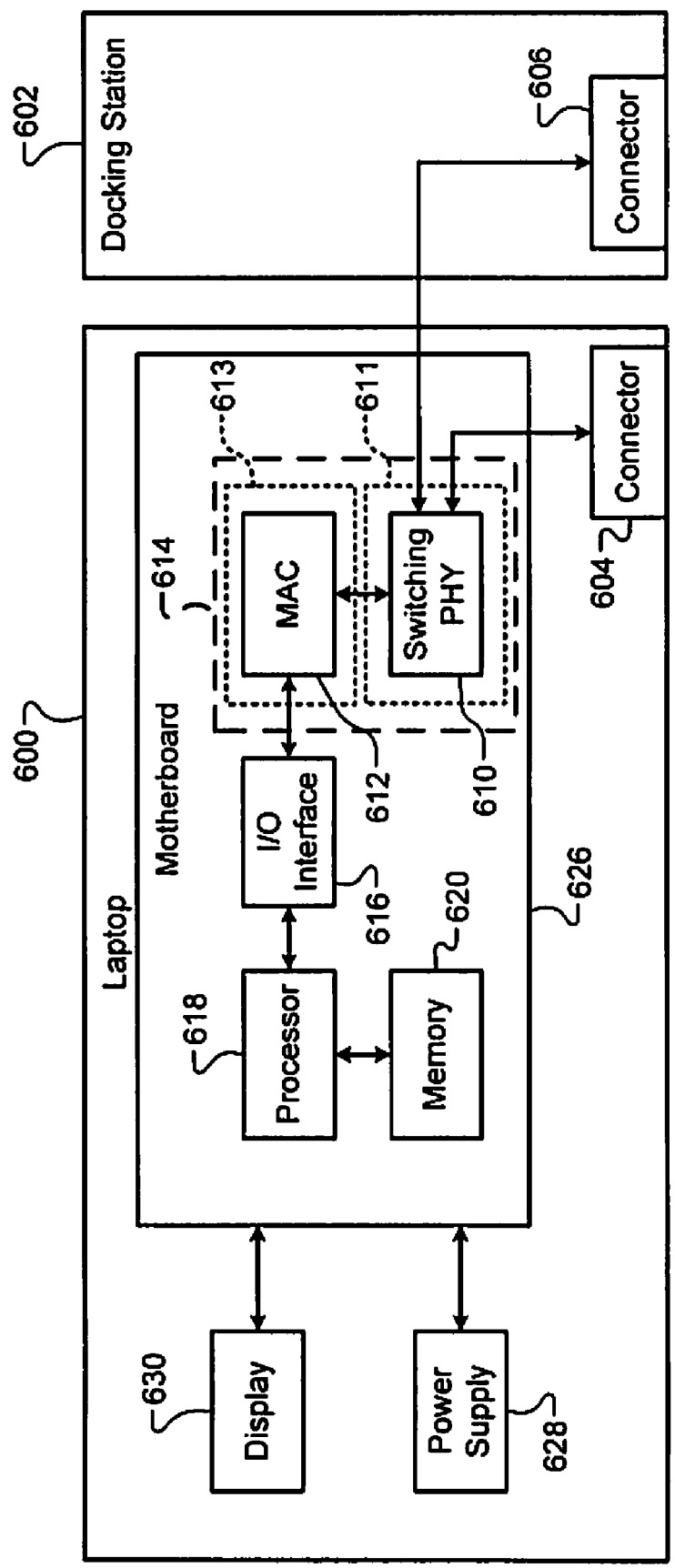
FIG. 17 is a functional block diagram of an exemplary laptop docking system according to the principles of the present disclosure.

Referring now to FIG. 17, a functional block diagram of an exemplary laptop docking system according to the principles of the present disclosure is presented. A laptop 600 is removably connected to a docking station 602. The laptop 600 and the docking station 602 include first and second network connectors 604 and 606, respectively. The first and second network connectors 604 and 606 communicate with a switching physical layer (PHY) device 610.

The switching PHY device 610 selects between the first and second network connectors 604 and 606. This selection may be made based upon whether the laptop 600 is connected to the docking station 602. In various implementations, the switching PHY device 610 may automatically select the second network connector 606 when the laptop 600 is connected to the docking station 602.

In the prior art, signals from network connectors are switched before the signals are terminated, as shown in FIGS. 15A-15B. The switch creates a voltage divider, and a portion of the signal voltage is lost across the switch. This reduces the signal strength of incoming signals received by the near-end receiver, as well as outgoing signals transmitted to the far-end receiver. Instead of switching signals prior to termination, the switching PHY device 610 switches signals after the signals have been terminated.

By actively switching the signals after they have been terminated, the switch resistance of the switching PHY device 610 does not reduce the magnitude of the signals across the termination networks. Switches within the switching PHY device 610 are thus not subject to an unworkable tradeoff between higher capacitance and lower resistance, as shown in FIGS. 13A-13C. The switches can be made smaller to achieve adequate bandwidth performance, while the associated increased resistance does not reduce signal strength.

The switching PHY device 610 communicates with a media access control (MAC) device 612. A network interface module 614 includes the switching PHY device 610, the MAC device 612, and optionally a host interface (not shown). In various implementations, the switching PHY device 610 and/or the MAC device 612 may be integrated in single integrated circuits 611 and 613, respectively. In various implementations, the network interface module 614 may be integrated as a single integrated circuit.

The MAC device 612 may communicate with an input/output (I/O) interface 616 or may communicate with the I/O interface 616 via the optional host interface. A processor 618 communicates with memory 620 and with the I/O interface 616. The network interface module 614, the I/O interface 616, the processor 618, and memory 620 may be located on a motherboard 626 of the laptop 600. The motherboard 626 may communicate with other components such as a power supply 628 and a display 630.

Figure 16A:
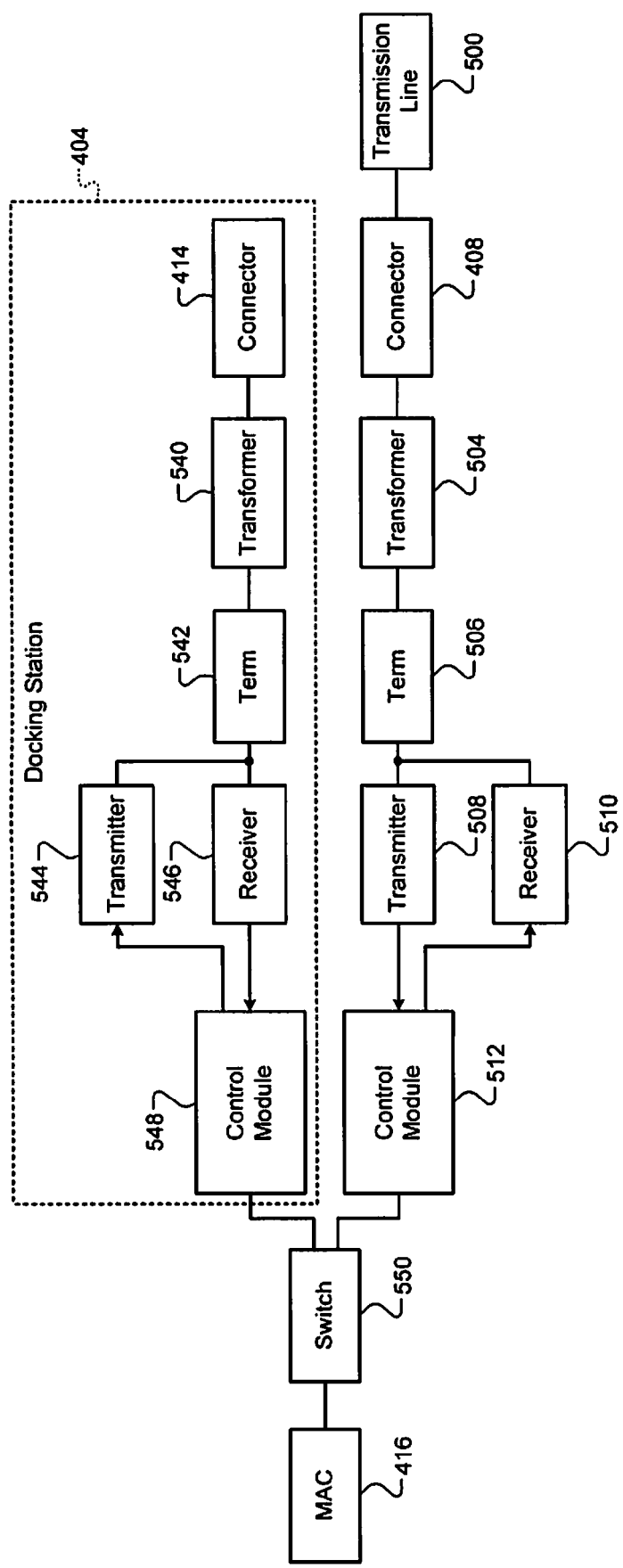
FIG. 16A is a functional block diagram of another switched network interface according to the prior art.
Figure 16B:
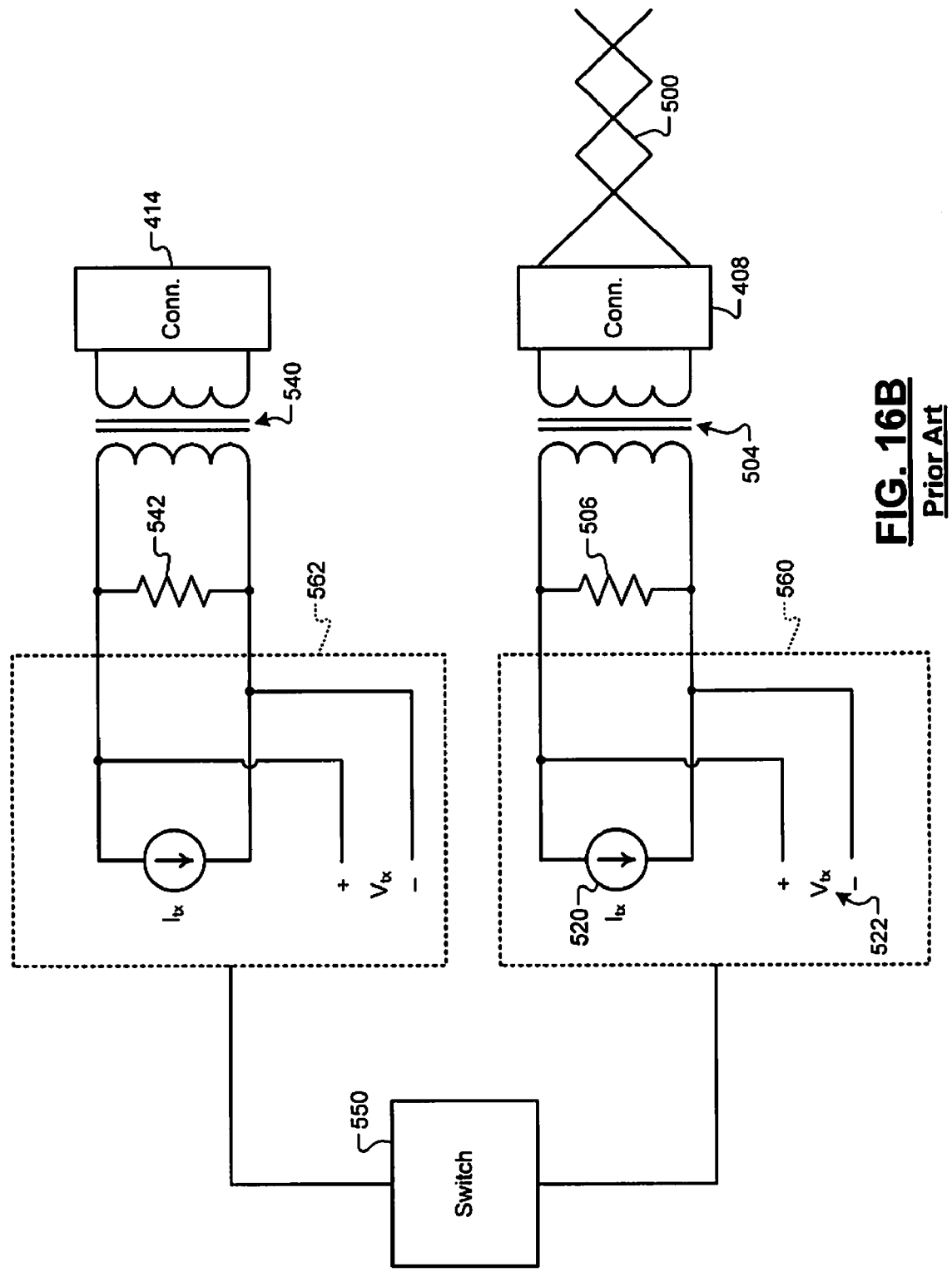
FIG. 16B is a functional schematic diagram of the switched network interface of FIG. 16A.

Referring now generally to FIGS. 18A-25B, various implementations of switching PHY devices according to the present disclosure are shown. These switching PHY devices perform switching after signals have been terminated, in contrast to the prior art, such as FIGS. 15A-15B. In addition, these switching PHY devices do not implement an entire duplicate PHY associated with the docking station 602, as does another switching system of the prior art, depicted in FIGS. 16A-16B.

Figure 18A:
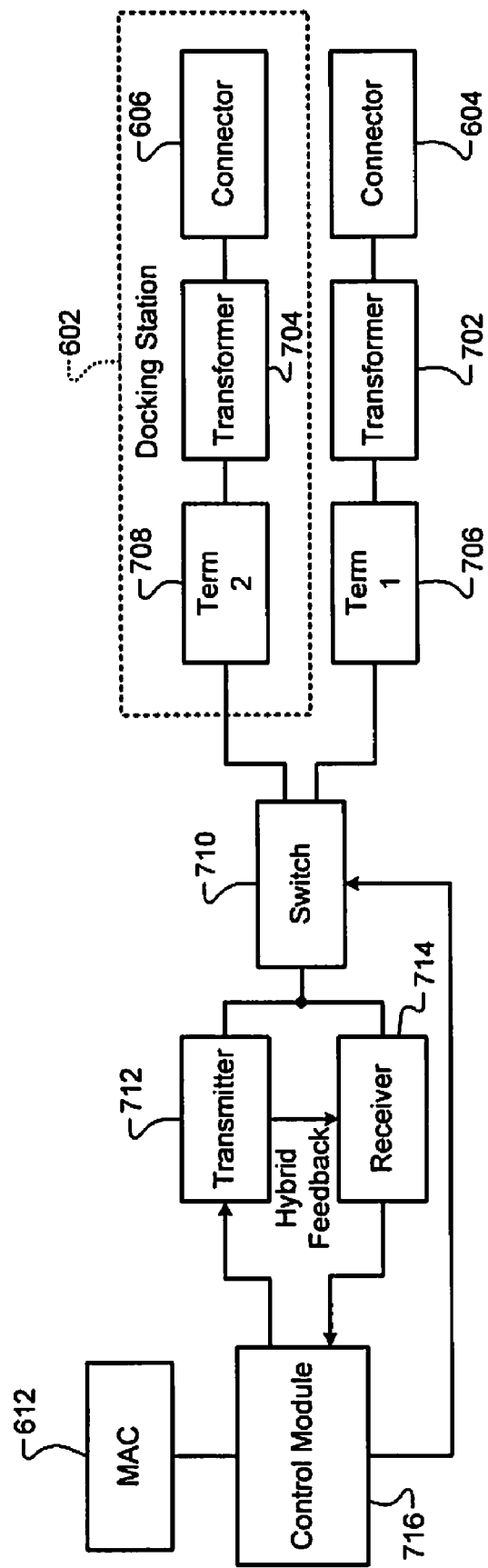
FIG. 18A is a functional block diagram of an exemplary switching network interface according to the principles of the present disclosure.

More particularly, FIGS. 18A-21B depict various switching PHY devices according to the principles of the present disclosure. FIGs. having a B suffix depict exemplary schematic implementations of FIGs. having an A suffix. In FIGS. 18A and 20A, the transmitters and receivers implement transformerless hybrids, while FIGS. 19A and 21A include external hybrids, such as magnetic hybrids.

Figure 19A:
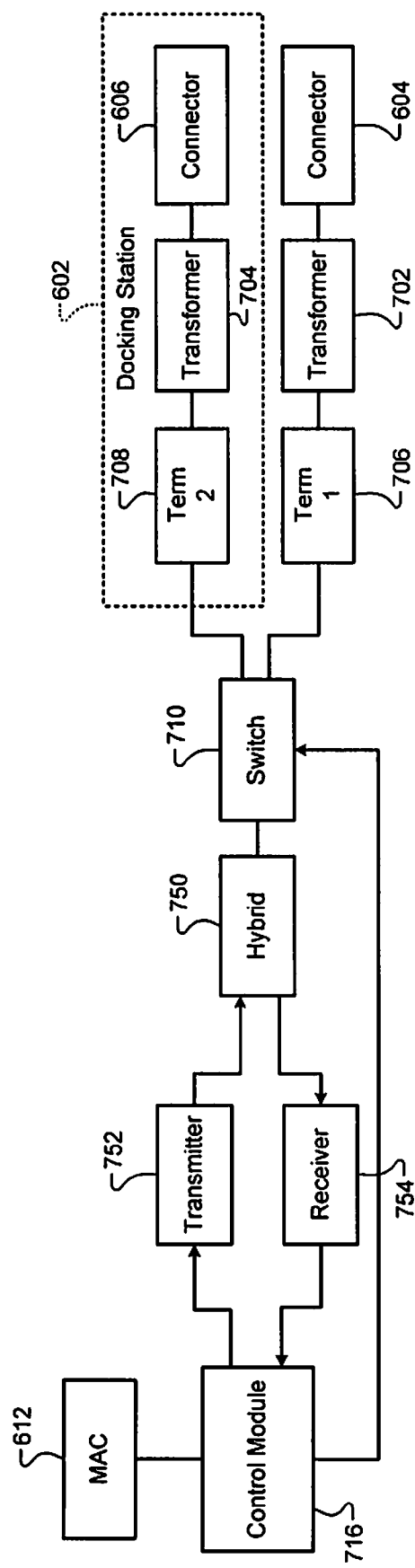
FIG. 19A is a functional block diagram of an exemplary switching network interface according to the principles of the present disclosure including a hybrid.
Figure 20A:
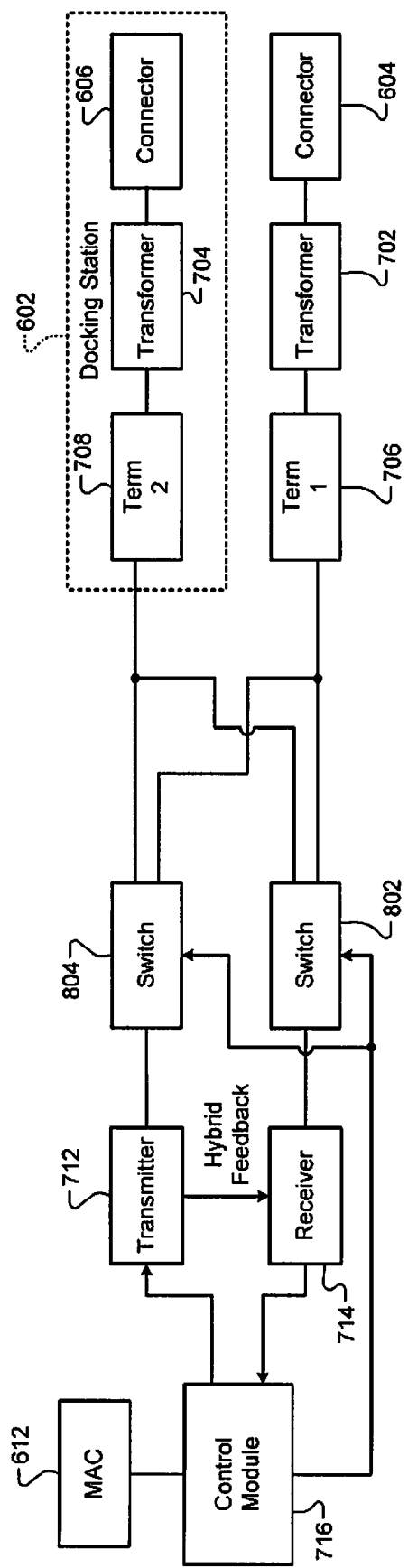
FIG. 20A is a functional block diagram of an exemplary switching network interface according to the principles of the present disclosure including separate transmitter/receiver switches.
Figure 21A:
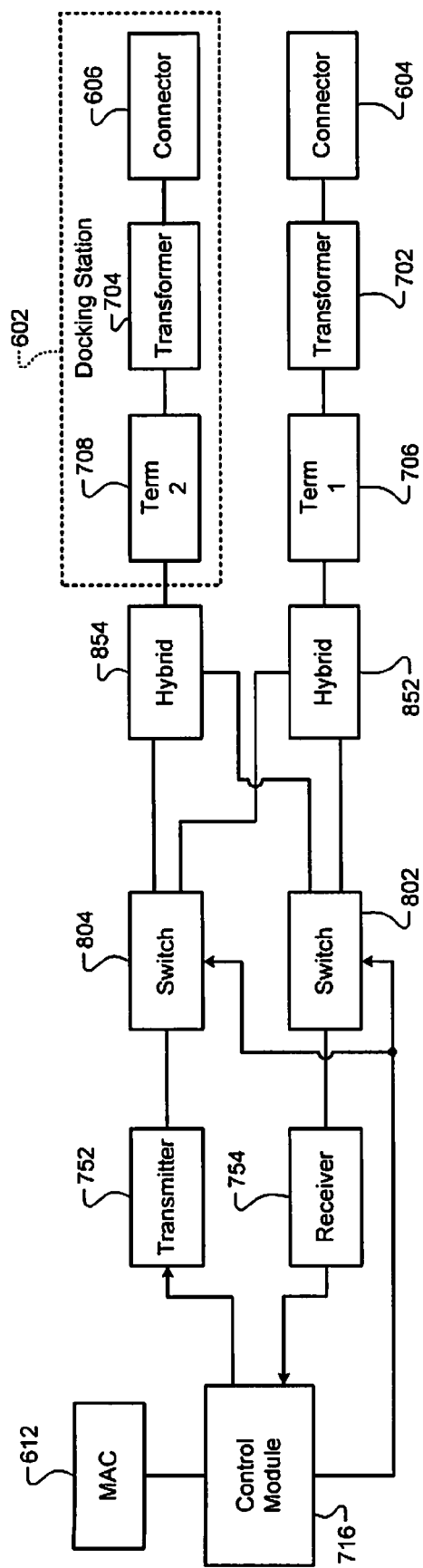
FIG. 21A is a functional block diagram of an exemplary switching network interface according to the principles of the present disclosure including separate transmitter/receiver switches and hybrids.
Figure 22A:
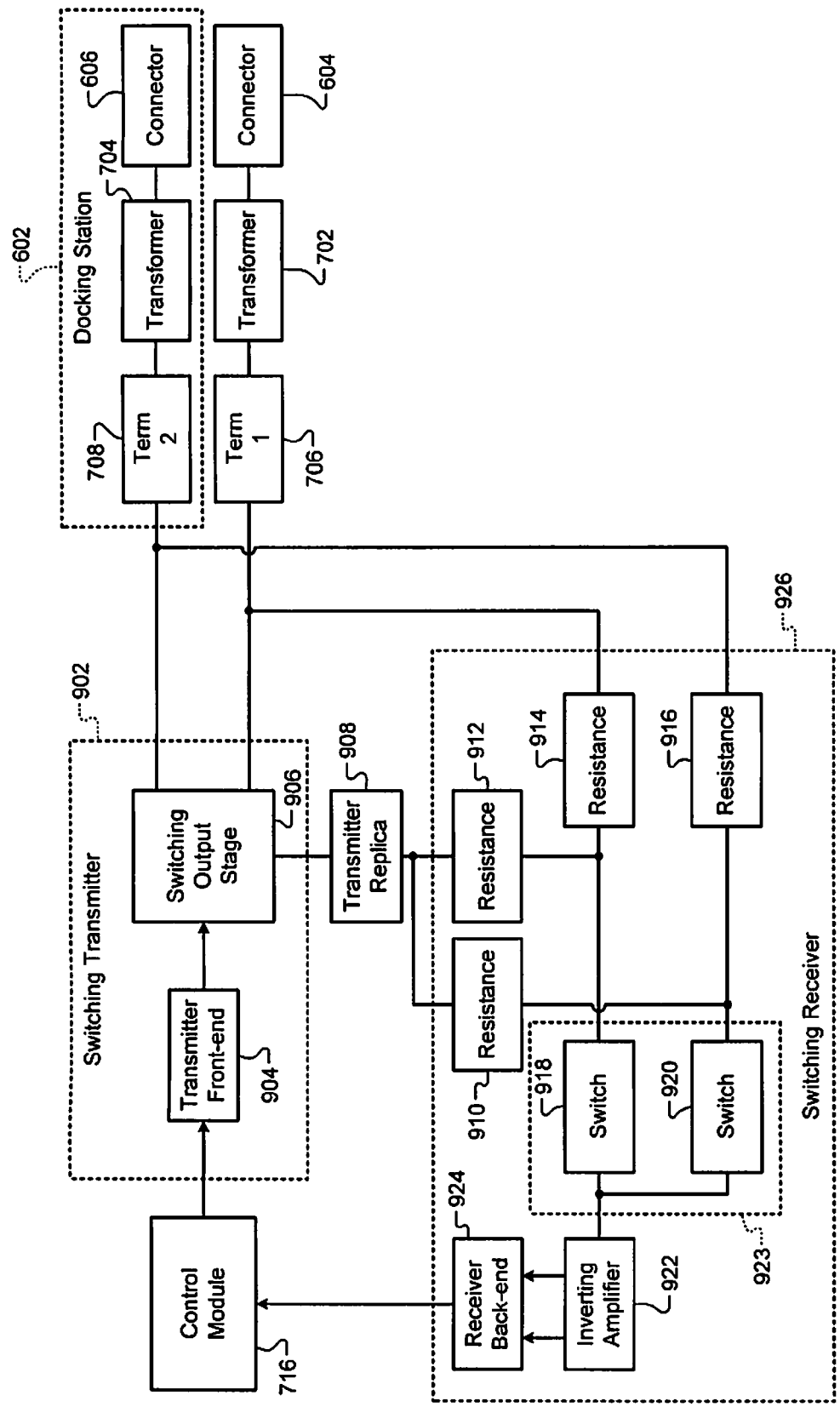
FIG. 22A is a functional block diagram of an exemplary switching network interface with switching functionality integrated into the transmitter and receiver according to the principles of the present disclosure.
Figure 22B:
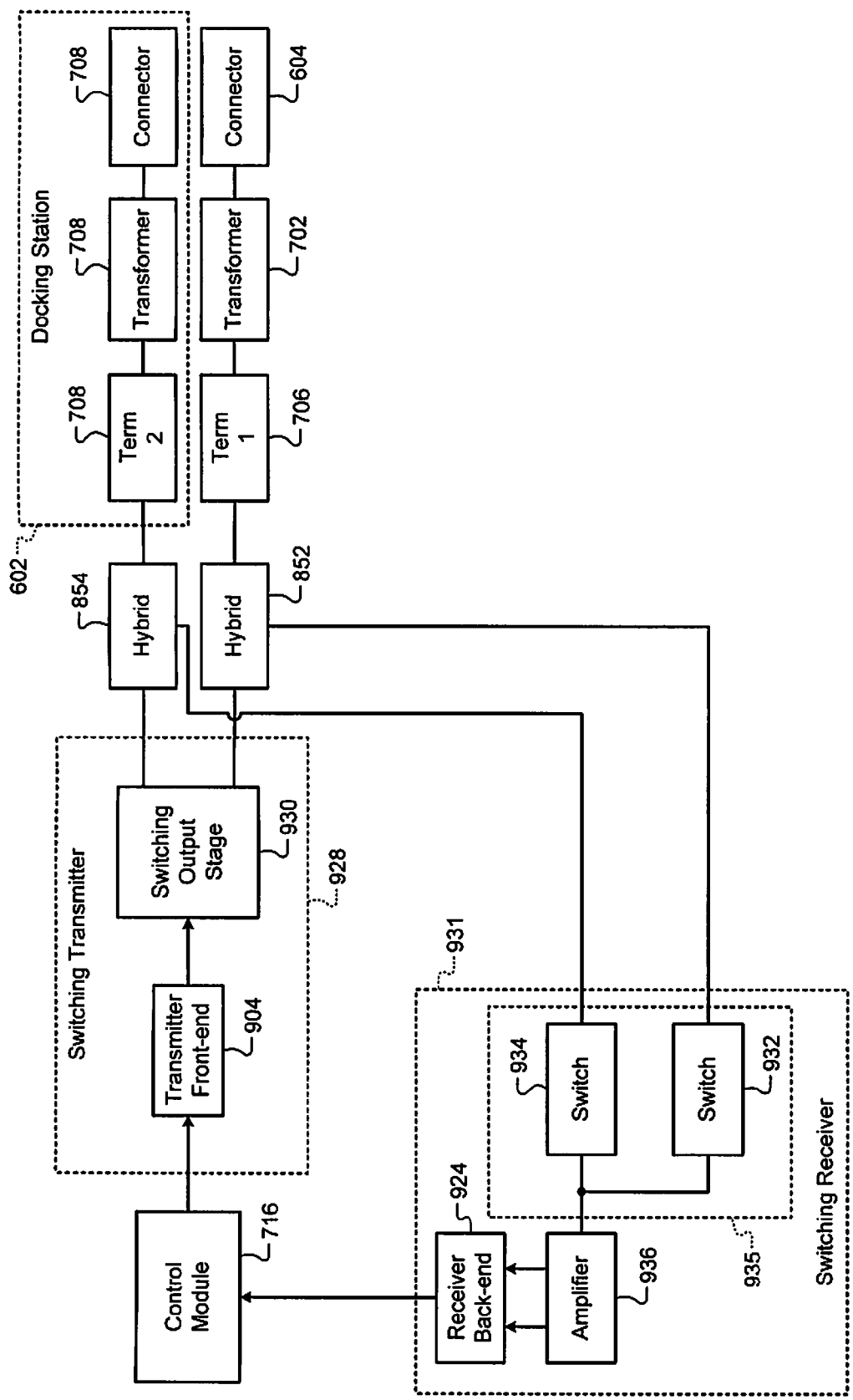
FIG. 22B is a functional block diagram of an exemplary switching network interface that includes hybrids and has switching functionality integrated into the transmitter and receiver according to the principles of the present disclosure.

FIGS. 18A and 19A include switch modules shared by the transmitter and receiver, while FIGS. 20A and 21A include separate switch modules for the transmitter and receiver. FIGS. 22A-22B include switching functionality integrated into the transmitter and into the receiver. FIGS. 23-25B present exemplary schematic implementations of components of FIGS. 22A-22B.

Referring now to FIG. 18A, a functional block diagram of an exemplary switching network interface according to the principles of the present disclosure is presented. The first and second network connectors 604 and 606 communicate with first and second transformers 702 and 704, respectively. The first and second transformers 702 and 704 communicate with first and second termination networks 706 and 708, respectively.

The first and second termination networks 706 and 708 may include resistances and/or reactive components. A switch 710 communicates with the first and second termination networks 706 and 708. The switch 710 selectively couples one of the first and second termination networks 706 and 708 to both a transmitter 712 and a receiver 714. A control module 716 transmits data to the transmitter 712 and receives data from the receiver 714.

The control module 716 communicates with the MAC device 612. The control module 716 controls the switch 710 to select one of the first and second network connectors 604 and 606. The control module 716 also performs processing tasks associated with the physical layer. These tasks may include modulation, line coding, error correction coding, bit synchronization, signaling and flow control, carrier sense and collision detection, equalization filtering, pulse shaping, and other signal processing of physical signals.

The transmitter 712 and the receiver 714 implement a transformerless hybrid, whereby a hybrid feedback signal is output by the transmitter 712 to the receiver 714. The hybrid feedback signal allows the receiver 714 to filter out the contribution of the transmitter 712 from a combined transmit and receive signal when operating in full-duplex mode.

According to the present disclosure, an integrated circuit may integrate the first termination network 706, the switch 710, the transmitter 712, the receiver 714, and/or the control module 716. The integrated circuit may also integrate switching modules, additional termination networks, hybrids, and/or transformers.

Figure 18B:
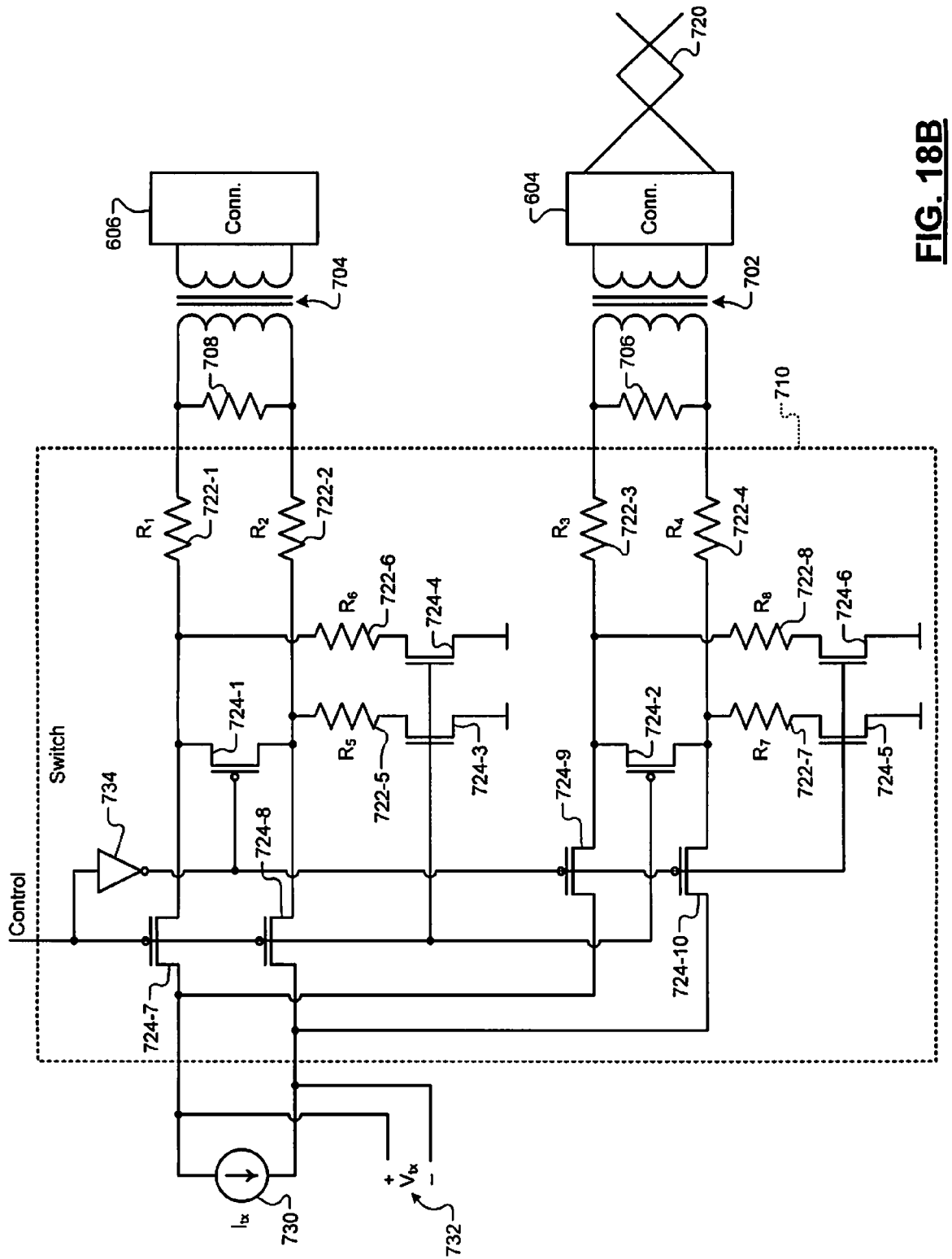
FIG. 18B is an exemplary functional schematic diagram of the switching network interface of FIG. 18A.

Referring now to FIG. 18B, an exemplary functional schematic diagram of the switching network interface of FIG. 18A is presented. For purposes of illustration, a transmission line 720 is connected to the first network connector 604. While the transmission line 720 is shown as a single twisted pair, the teachings of the present disclosure apply to multiple twisted pairs.

Multiple twisted pairs, such as are used in Gigabit Ethernet, may be switched using similar circuit structures that are controlled in parallel. The first and second network connectors 604 and 606 communicate with the first and second transformers 702 and 704, respectively. The first and second transformers 702 and 704 communicate with the first and second termination networks 706 and 708, respectively.

For purposes of illustration, the first and second termination networks 706 and 708 are depicted in FIG. 18B as resistances having first and second ends. The switch 710 includes first, second, third, fourth, fifth, sixth, seventh, and eighth resistances 722-1, 722-2, 722-3, 722-4, 722-5, 722-6, 722-7, and 722-8. The switch 710 includes first, second, third, fourth, fifth, sixth, seventh, eighth, ninth, and tenth transistors 724-1, 724-2, 724-3, 724-4, 724-5, 724-6, 724-7, 724-8, 724-9, and 724-10.

The transistors 724 may be metal oxide semiconductor field-effect transistors (MOSFETs), and may have control terminals and first and second terminals. The first and second terminals of the first transistor 724-1 communicate with the first and second ends of the second termination network 708 via the first and second resistances 722-1 and 722-2, respectively.

The first and second terminals of the second transistor 724-2 communicate with the first and second ends of the first termination network 706 via the third and fourth resistances 722-3 and 7224, respectively. The first terminals of the third and fourth transistors 724-3 and 724-4 communicate with the second and first terminals of the first transistor 724-1 via the fifth and sixth resistances 722-5 and 722-6, respectively.

The first terminals of the fifth and sixth transistors 724-5 and 724-6 communicate with the second and first terminals of the second transistor 724-2 via the seventh and eighth resistances 722-7 and 722-8, respectively. A current source $I_{tx}$ 730 includes first and second ends and provides a transmit current $I_{tx}$. First and second ends of the current source $I_{tx}$ 730 communicate with the first and second terminals of the first transistor 724-1 via the seventh and eighth transistors 724-7 and 724-8.

The first and second terminals of the current source $I_{tx}$ 730 communicate with the first and second terminals of the second transistor 724-2 via the ninth and tenth transistors 724-9 and 724-10, respectively. A voltage $V_{rx}$ 732 is measured across the first and second terminals of the current source $I_{tx}$ 730. A control signal is received by the switch 710 and communicated to the control terminals of the second, fourth, third, seventh, and eighth transistors 724-2, 724-3, 724-4, 724-7, and 724-8.

The control signal may be inverted by an inverter 734, whose output is communicated to the first, fifth, sixth, ninth, and tenth transistors 724-1, 724-5, 724-6, 724-9, and 724-10. In various implementations, the first, second, seventh, eighth, ninth, and tenth transistors 724-1, 724-2, 724-7, 724-8, 724-9, and 724-10 may be PMOS transistors. In various implementations, the third, fourth, fifth, and sixth transistors 724-3, 724-4, 724-5, and 724-6 may be NMOS transistors.

When the control signal is high, the first network connector 604 is connected to the current source $I_{tx}$ 730 via the ninth and tenth transistors 724-9 and 724-10. Meanwhile, the seventh and eighth transistors 724-7 and 724-8 disconnect the second network connector 606 from the current source $I_{tx}$ 730. The first transistor 724-1 shorts together the first and second resistances 722-1 and 722-2 coming from the second network connector 606.

In addition, the third and fourth transistors 724-3 and 7244 tie the second ends of the first and second resistances 722-1 and 722-2 to ground. When the polarity of the control signal is reversed, the transistors 724 assume opposite roles and the second network connector 606 is connected to the current source $I_{tx}$ 730 while the first network connector 604 is grounded.

Referring now to FIG. 19A, a functional block diagram of a switching network interface according to the principles of the present disclosure including a hybrid is depicted. The switch 710 communicates with a hybrid 750. The hybrid 750 communicates transmit signals from a transmitter 752 to the switch 710. The hybrid 750 communicates received signals from the switch 710 to a receiver 754 without including the transmit signals from the transmitter 752. The hybrid 750 thus allows full duplex communication by separating out received signals from the transmit signals going to the switch 710.

Figure 19B:
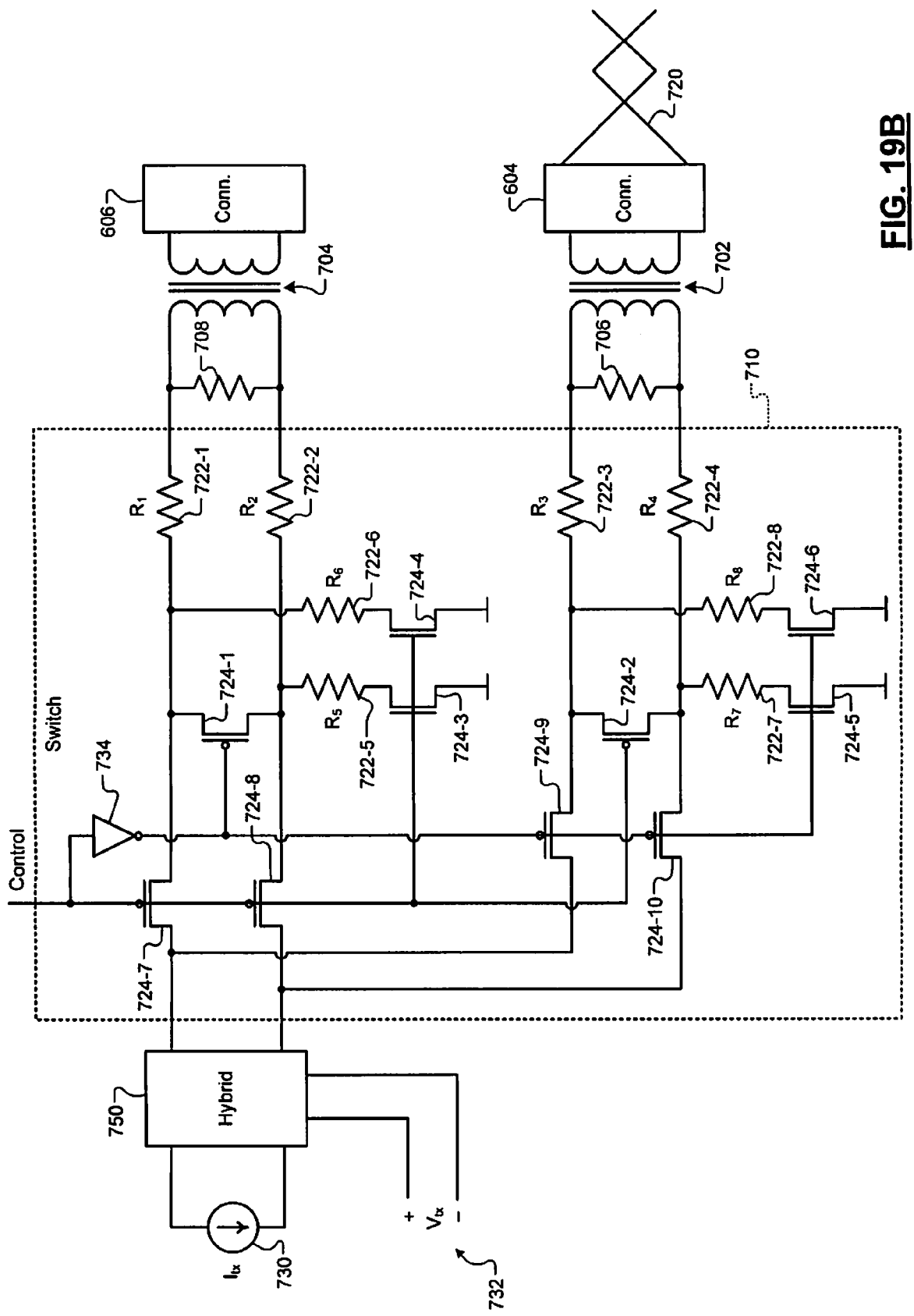
FIG. 19B is an exemplary functional schematic diagram of the switching network interface of FIG. 19A.

Referring now to FIG. 19B, an exemplary functional schematic diagram of the switching network interface of FIG. 19A is presented. The hybrid 750 separates transmit signals, as represented by the current source $I_{tx}$ 730, from received signals, as represented by the voltage $V_{rx}$ 732. The hybrid 750 communicates with the seventh, eighth, ninth, and tenth transistors 724-7, 724-8, 724-9, and 724-10.

Referring now to FIG. 20A, a functional block diagram of an exemplary switching network interface according to the principles of the present disclosure including separate transmitter/receiver switches is presented. The control module 716 controls operation of first and second switch modules 802 and 804. The first switch module 802 selectively connects the first and second termination networks 706 and 708 to the receiver 714.

The second switch module 804 selectively connects the first and second termination networks 706 and 708 to the transmitter 712. The transmitter 712 and the receiver 714 implement a transformerless hybrid. In various implementations, the transmitter 712 communicates a hybrid feedback signal to the receiver 714. This hybrid feedback signal may be proportional to the transmit signal generated by the transmitter 712. The receiver 714 can then remove the effect of the transmit signal from the combined transmit/receive signal to obtain a receive signal.

Figure 20B:
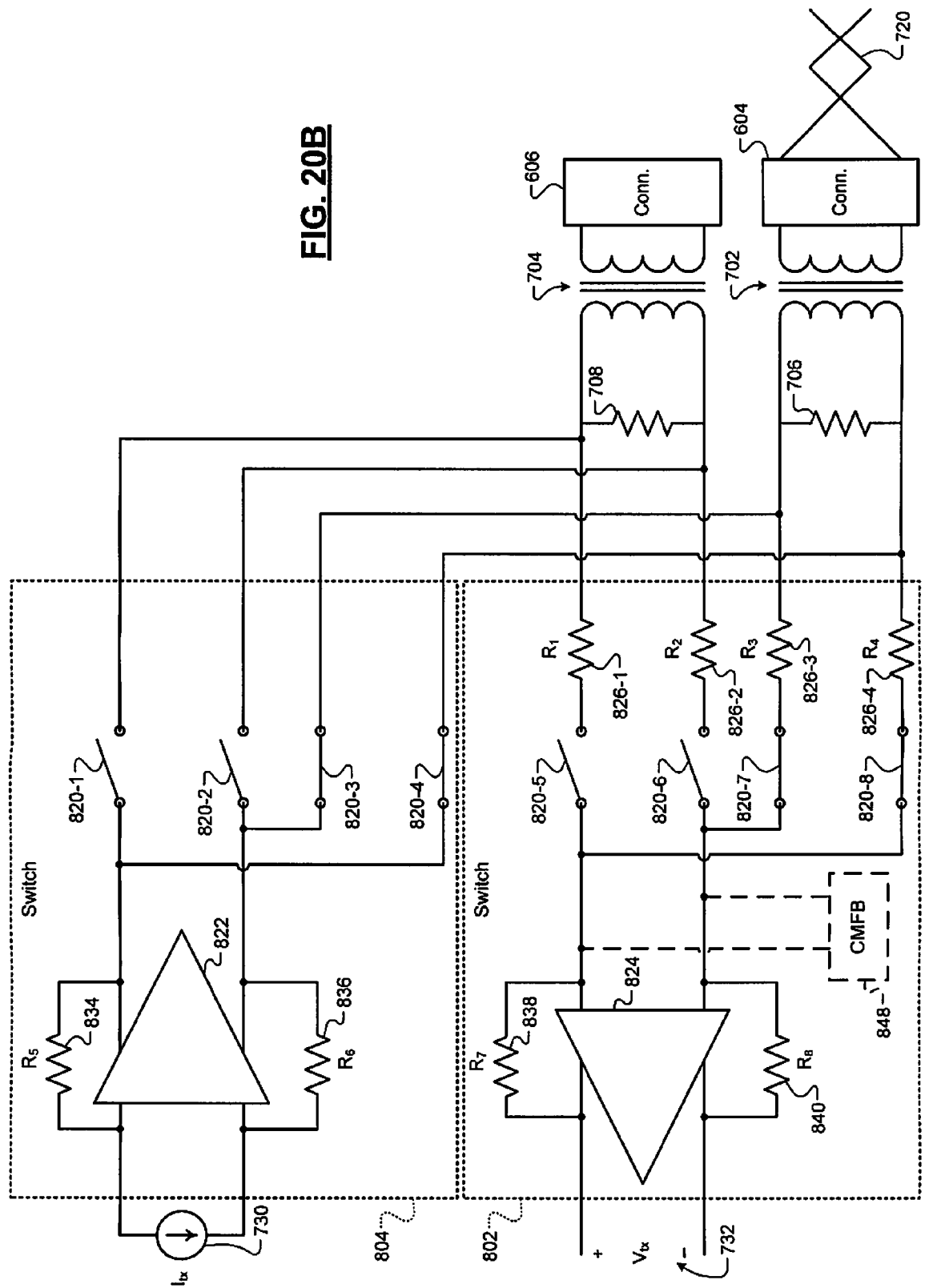
FIG. 20B is an exemplary functional schematic diagram of the switching network interface of FIG. 20A.

Referring now to FIG. 20B, an exemplary functional schematic diagram of the switching network interface of FIG. 20A is presented. The first and second network connectors 604 and 606 accept connection of the transmission line 720. For purposes of illustration, the transmission line 720 is shown connected to the first network connector 604.

The first and second network connectors 604 and 606 communicate with the first and second transformers 702 and 704, respectively. The first and second ends of the first transformer 702 communicate with the first and second ends of the first termination network 706, depicted graphically as a resistance. The first and second ends of the second transformer 704 communicate with the first and second ends of the second termination network 708, depicted graphically as a resistance.

The first and second switch modules 802 and 804 include first, second, third, fourth, fifth, sixth, seventh, and eighth switches 820-1, 820-2, 820-3, 820-4, 820-5, 820-6, 820-7, and 820-8. The first and second switches 820-1 and 820-2 selectively connect first and second outputs of a first amplifier 822 to the first and second ends of the second termination network 708, respectively.

The third and fourth switches 820-3 and 820-4 selectively connect the first and second outputs of the first amplifier 822 to the first and second ends of the first termination network 706. The fifth and sixth switches 820-5 and 820-6 selectively connect first and second inputs of a second amplifier 824 to first ends of first and second resistances 826-1 and 826-2, respectively.

Opposite ends of the first and second resistances 826-1 and 826-2 communicate with the first and second ends of the second termination network 708. The seventh and eighth switches 820-7 and 820-8 selectively connect the first and second inputs of the second amplifier 824 to first ends of third and fourth resistances 826-3 and 826-4, respectively. Opposite ends of the third and fourth resistances 826-3 and 826-4 communicate with the first and second ends of the first termination network 706.

The current source $I_{tx}$ 730 is applied to first and second inputs of the first amplifier 822. The voltage $V_{rx}$ 732 is measured from first and second outputs of the second amplifier 824. A fifth resistance 834 communicates with the first input and the first output of the first amplifier 822. A sixth resistance 836 communicates with the second input and the second output of the first amplifier 822.

A seventh resistance 838 communicates with the first output and the first input of the second amplifier 824. An eighth resistance 840 communicates with the second output and the second input of the second amplifier 824. The switches 820 determine which one of the first and second network connectors 604 and 606 will be connected to the first and second amplifiers 822 and 824.

To select the first network connector 604, the third, fourth, seventh, and eighth switches 820-3, 820-4, 820-7, and 820-8 are closed, as shown in FIG. 20B. Meanwhile, the first, second, fifth, and sixth switches 820-1, 820-2, 820-5, and 820-6 are opened. A common mode feedback module 848 communicates with the first and second inputs of the second amplifier 824. The common mode feedback module 848 is optional, as indicated by the dashed lines. The common mode feedback module 848 may be used to shift incoming signals to a voltage range that is more compatible with a device receiving the voltage $V_{rx}$ 732. An exemplary implementation of the common mode feedback module 848 is depicted in FIG. 7.

Referring now to FIG. 21A, a functional block diagram of an exemplary switching network interface according to the principles of the present disclosure including separate transmitter/receiver switches and hybrids is presented. The control module 716 controls operation of the first and second switch modules 802 and 804. The first switch module 802 selectively connects a first hybrid 852 and a second hybrid 854 to the receiver 754. The second switch module 804 selectively connects the first and second hybrids 852 and 854 to the transmitter 752. The first and second hybrids 852 and 854 communicate with the first and second termination networks 706 and 708, respectively.

Figure 21B:
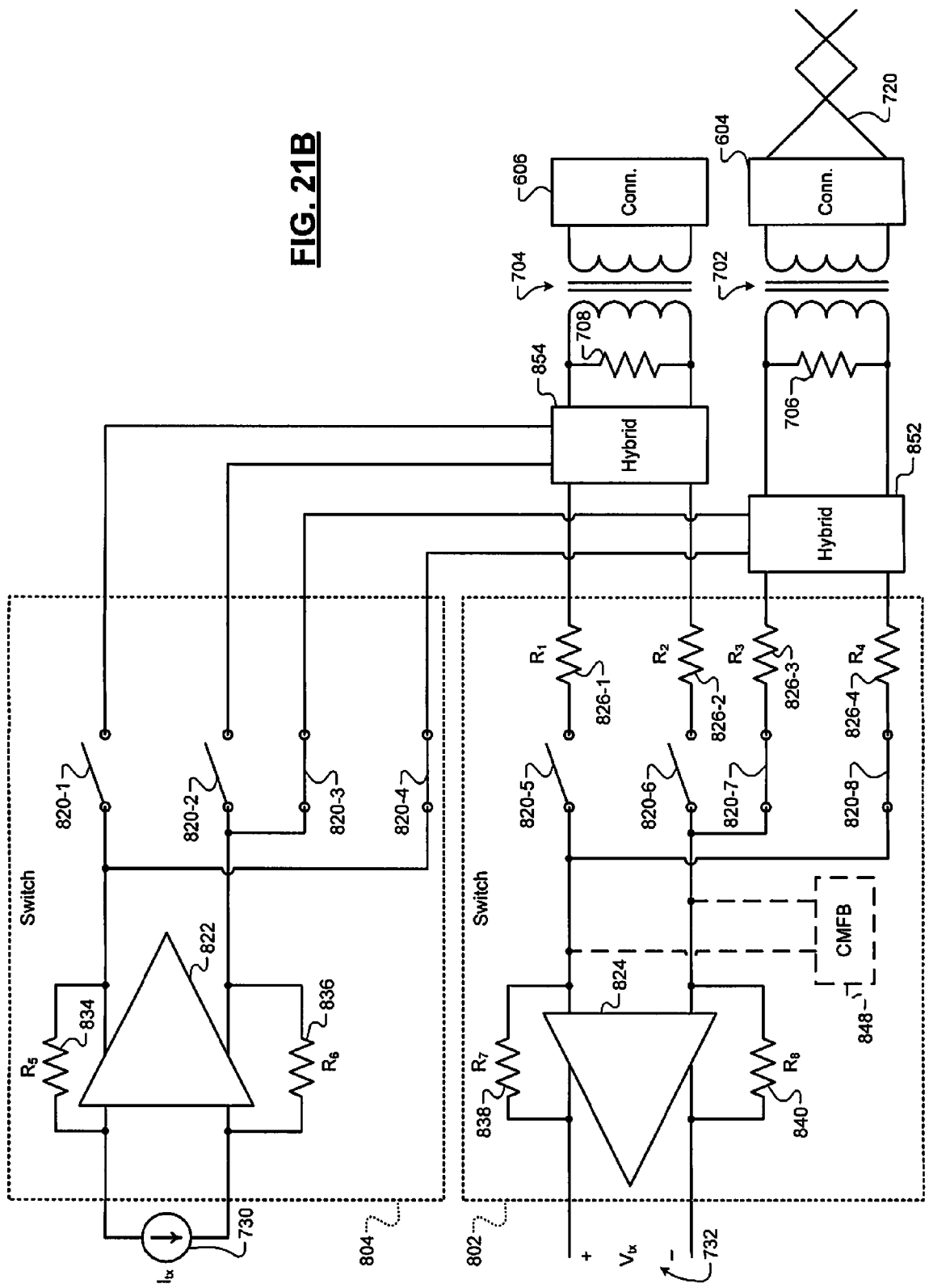
FIG. 21B is an exemplary functional schematic diagram of the switching network interface of FIG. 21A.

Referring now to FIG. 21B, an exemplary functional schematic diagram of the switching network interface of FIG. 21A is presented. The first hybrid 852 communicates with the first termination network 706 and with the first and second switch modules 802 and 804. The second hybrid 854 communicates with the second termination network 708 and with the first and second switch modules 802 and 804.

Referring now to FIG. 22A, a functional block diagram of an exemplary switching network interface with switching functionality integrated into the transmitter and receiver according to the principles of the present disclosure is presented. A switching transmitter 902 includes a transmitter front-end 904 and a switching output stage 906. The switching output stage communicates with the first and second termination networks 706 and 708.

The switching output stage 906 includes output drivers that selectively output signals from the transmitter front-end 904 to the first and second termination networks 706 and 708. The switching output stage 906 also outputs a copy of the signals from the transmitter front-end 904 to a transmitter replica 908. The transmitter replica 908 may be included within the switching transmitter 902.

The transmitter replica 908 outputs transmit signals to first ends of first and second resistances 910 and 912. The node at which the switching output stage 906 communicates with the first termination network 706 and the node at which the switching output stage 906 communicates with the second termination network 708 communicate with first ends of third and fourth resistances 914 and 916, respectively.

Opposite ends of the second and third resistances 912 and 914 communicate with each other and with a first switch 918. Opposite ends of the first and fourth resistances 910 and 916 communicate with each other and with a second switch 920. The first and second switches 918 and 920 selectively connect their inputs to an inverting amplifier 922. The first and second switches 918 and 920 together form a switch module 923.

The inverting amplifier 922 outputs an amplified signal to a receiver back end 924. The receiver back-end 924 communicates data to the control module 716, which communicates data to the transmitter front-end 904. The inverting amplifier 922 serves as a summing amplifier. When the first switch 918 is conducting and the second switch 920 is non-conducting, the inverting amplifier 922 sums signals from the transmitter replica 908 and the first termination network 706.

These signals are received at the first switch 918 via the second and third resistances 912 and 914, respectively. When the second switch 920 is conducting and the first switch 918 is non-conducting, the inverting amplifier 922 sums the signals from the transmitter replica 908 and the second termination network 708. These signals are received at the second switch 920 via the first and fourth resistances 910 and 916, respectively.

The inverting amplifier 922, the receiver back-end 924, the switches 918 and 920, and the resistances 910, 912, 914, and 916 form a switching receiver 926. The switching receiver 926 may include the transmitter replica 908, and may be integrated with the switching transmitter 902 and/or the control module 716. In addition, the first and/or second termination networks 706 and 708 may be integrated with the switching transmitter 902 and/or the switching receiver 926.

Voltages at the first and second termination networks 706 and 708 may exceed the operating limits of the first and second switches 918 and 920. For instance, operating limits of the first and second switches may be limited by their size or by their power supply voltage. The inputs to the first and second switches 918 and 920, however, are summing nodes. The voltages experienced by the first and second switches 918 and 920 have therefore been reduced by transmit signals, such as from the transmitter replica 908. This reduces the power supply and power handling requirements of the switches 918 and 920, allowing them to be smaller, use lower power supplies, and be more easily integrated into an integrated circuit.

Referring now to FIG. 22B, a functional block diagram of an exemplary switching network interface including hybrids and having switching functionality integrated with the transmitter and receiver according to the principles of the present disclosure is presented. A switching transmitter 928 includes the transmitter front-end 904 and a switching output stage 930, which may be similar to the switching output stage 906 of FIG. 22A. The switching output stage 930 communicates with the first and second hybrids 852 and 854.

The first hybrid 852 communicates transmit signals from the switching output stage 930 to the first termination network 706 and communicates receive signals from the first termination network 706 to a first switch 932. The second hybrid 854 communicates transmit signals from the switching output stage 930 to the second termination network 708 and communicates received signals from the second termination network 708 to a second switch 934.

The first and second switches 932 and 934 form a switch module 935 and may be similar to the first and second switches 918 and 920 of FIG. 22A. A switching receiver 931 includes the first and second switches 932 and 934, an amplifier 936, and the receiver back-end 924. The first and second switches 932 and 934 selectively connect the first and second hybrids 852 and 854, respectively, to the amplifier 936. The amplifier 936 communicates amplified signals to the receiver back-end 924.

Figure 23:
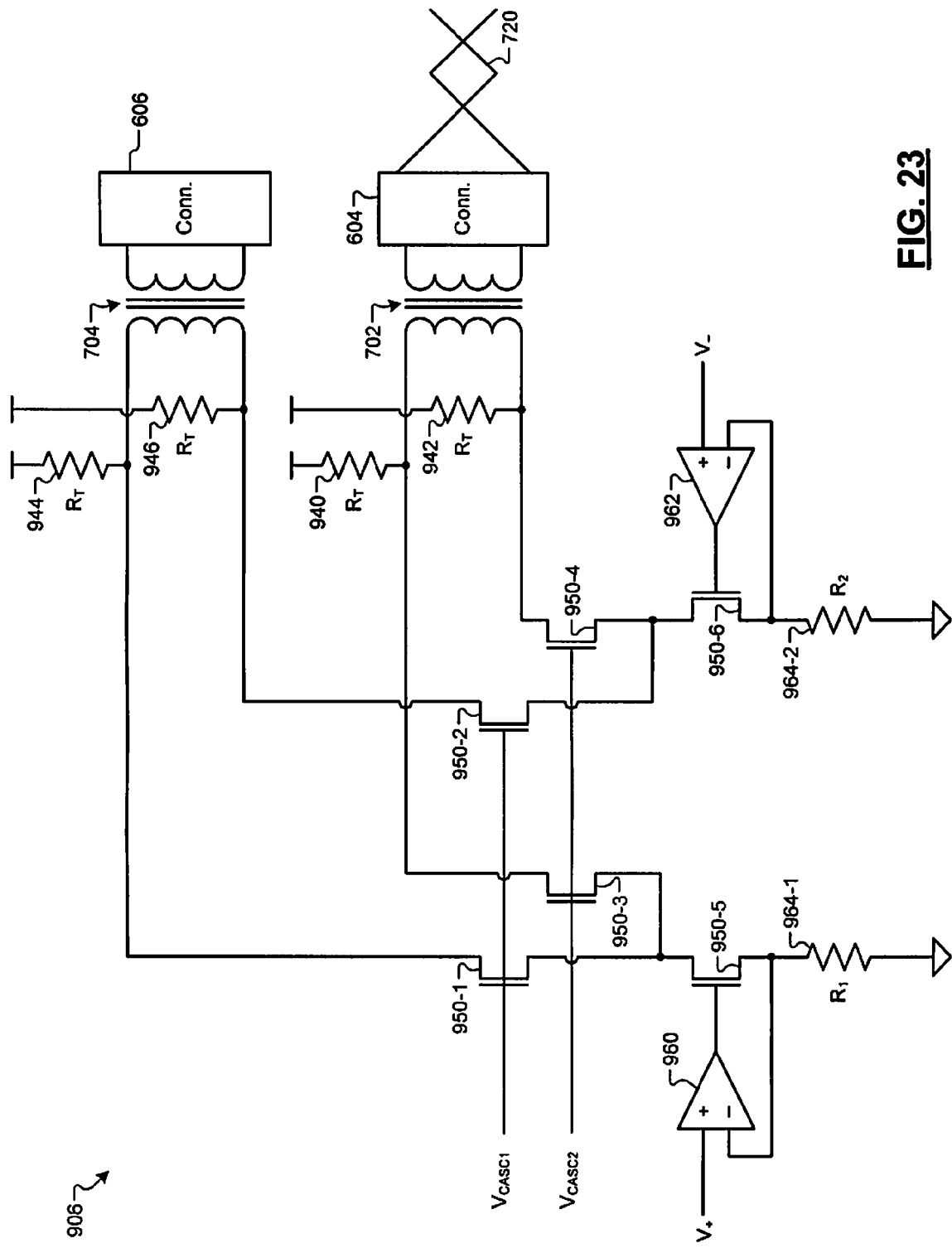
FIG. 23 is a functional schematic diagram of an exemplary switching output stage according to the principles of the present disclosure.

Referring now to FIG. 23, a functional schematic diagram of an exemplary switching output stage, such as the switching output stage 906 of FIG. 22A or the switching output stage 930 of FIG. 22B, according to the principles of the present disclosure is presented. Transmitters often include cascode transistors to protect the drive transistors of the transmitter. As described below, these cascode transistors can be used to switch the output of the transmitter. Because cascode transistors are already present, this approach adds very little capacitive load to the transmitter.

The first and second network connectors 604 and 606 communicate with the first and second transformers 702 and 704. For purposes of illustration, the transmission line 720 is connected to the first network connector 604. The first termination network 706 of FIG. 22A is represented here as first and second termination resistances 940 and 942. The first and second termination resistances 940 and 942 communicate between a supply potential and the first and second ends of the first transformer 702, respectively.

The second termination network 708 of FIG. 22A is represented as third and fourth termination resistances 944 and 946. The third and fourth termination resistances 944 and 946 communicate between the supply potential and the first and second ends of the second transformer 704, respectively.

First, second, third, fourth, fifth, and sixth transistors 950-1, 950-2, 950-3, 950-4, 950-5, and 950-6 may be metal oxide semiconductor field-effect transistors (MOSFETs) that have control terminals and first and second terminals.

The first terminals of the first and second transistors 950-1 and 950-2 communicate with the first and second ends of the second transformer 704, respectively. The first terminals of the third and fourth transistors 950-3 and 950-4 communicate with the first and second terminals of the first transformer 702, respectively.

The second terminals of the first and third transistors 950-1 and 950-3 communicate with the first terminal of the fifth transistor 950-5. The second terminals of the second and fourth transistors 950-2 and 950-4 communicate with the first terminal of the sixth transistor 950-6. The first and second transistors 950-1 and 950-2 are arranged as cascode transistors and their control terminals receive a first cascode voltage.

When the first cascode voltage is lowered, the first and second transistors 950-1 and 950-2 turn off, disconnecting the second transformer 704 from the fifth and sixth transistors 950-5 and 950-6. The third and fourth transistors 950-3 and 9504 are arranged as cascode transistors and their control terminals receive a second cascode voltage. When the second cascode voltage is lowered, the third and fourth transistors 950-3 and 9504 turn off, disconnecting the first transformer 702 from the fifth and six transistors 950-5 and 950-6. The first and second cascode voltages therefore control whether signals are transmitted to the first and second network connectors 604 and 606.

The fifth and sixth transistors 950-5 and 950-6 are drive transistors whose control terminals communicate with outputs of first and second operational amplifiers 960 and 962, respectively. Non-inverting inputs of the first and second operational amplifiers 960 and 962 receive first and second differential voltages from the transmitter front-end 904 of FIG. 22A.

Inverting inputs of the first and second operational amplifiers 960 and 962 communicate with the second terminals of the fifth and sixth transistors 950-5 and 950-6, respectively. The second terminals of the fifth and sixth transistors 950-5 and 950-6 communicate with a ground potential via first and second resistances 964-1 and 964-2, respectively.

Figure 24:
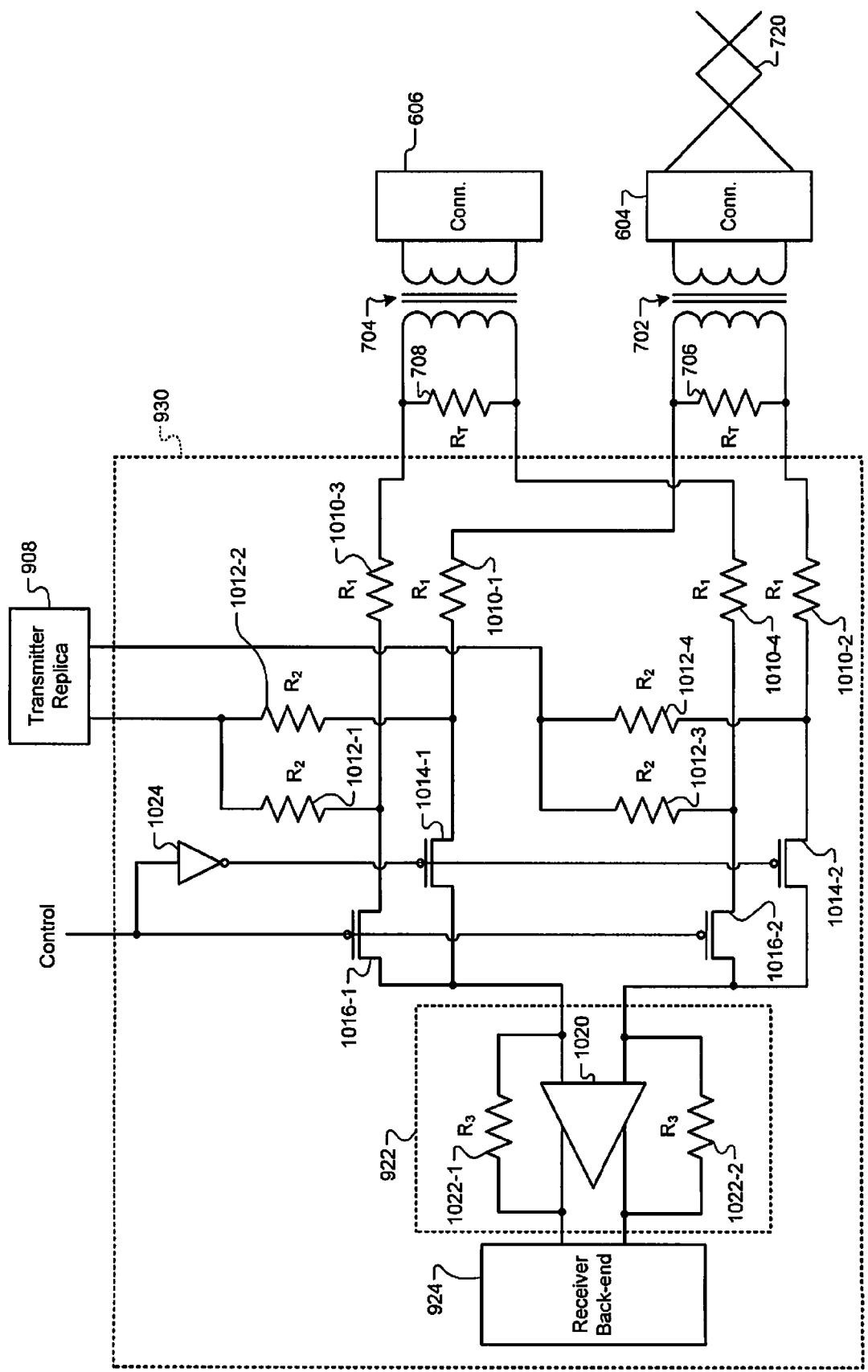
FIG. 24 is a functional schematic diagram of an exemplary switching receiver according to the principles of the present disclosure.

Referring now to FIG. 24, a functional schematic diagram of an exemplary switching receiver, such as the switching receiver 926 of FIG. 22A, according to the principles of the present disclosure is presented. The first and second ends of the first termination network 706 communicate with first ends of first and second resistances 1010-1 and 1010-2.

The first and second ends of the second termination network 708 communicate with first ends of third and fourth resistances 1010-3 and 1010-4, respectively. The transmitter replica 908 is shown with a differential output including first and second signals. The first output signal of the transmitter replica 908 communicates with first ends of fifth and sixth resistances 1012-1 and 1012-2.

The second output signal of the transmitter replica 908 communicates with first ends of seventh and eighth resistances 1012-3 and 1012-4. The first switch 918 of FIG. 22A may be composed of first and second transistors 1014-1 and 1014-2. The second switch 920 of FIG. 22A may be composed of third and fourth transistors 1016-1 and 1016-2.

The transistors 1014 and 1016 may be metal oxide semiconductor field-effect transistors (MOSFETs) that have control terminals and first and second terminals. The first terminal of the first transistor 1014-1 communicates with second ends of the first and sixth resistances 1010-1 and 1012-2. The first terminal of the second transistor 1014-2 communicates with second ends of the second and eighth resistances 1010-2 and 1012-4.

The first terminal of the third transistor 1016-1 communicates with second ends of the third and fifth resistances 1010-3 and 1012-1. The first terminal of the fourth transistor 1016-2 communicates with second ends of the fourth and seventh resistances 1010-4 and 1012-3. The second terminals of the first and third transistors 1014-1 and 1016-1 communicate with a first input of an amplifier 1020.

The second terminals of the second and fourth transistors 101-4-2 and 1016-2 communicate with a second input of the amplifier 1020. First and second outputs of the amplifier 1020 communicate with the receiver back-end 924. A ninth resistance 1022-1 communicates with the first input and the first output of the amplifier 1020. A tenth resistance 1022-2 communicates with the second input and the second output of the amplifier 1020.

A control signal is received from the control module 716 of FIG. 22A by the control terminals of the third and fourth transistors 1016-1 and 1016-2. The control signal may be inverted by an inverter 1024 before being communicated to the control terminals of the first and second transistors 1014-1 and 1014-2. The first and second transistors 1014 selectively connect the first termination network 706 to the amplifier 1020. The third and fourth transistors 1016-1 and 1016-2 selectively connect the second termination network 708 to the amplifier 1020.

Figure 25B:
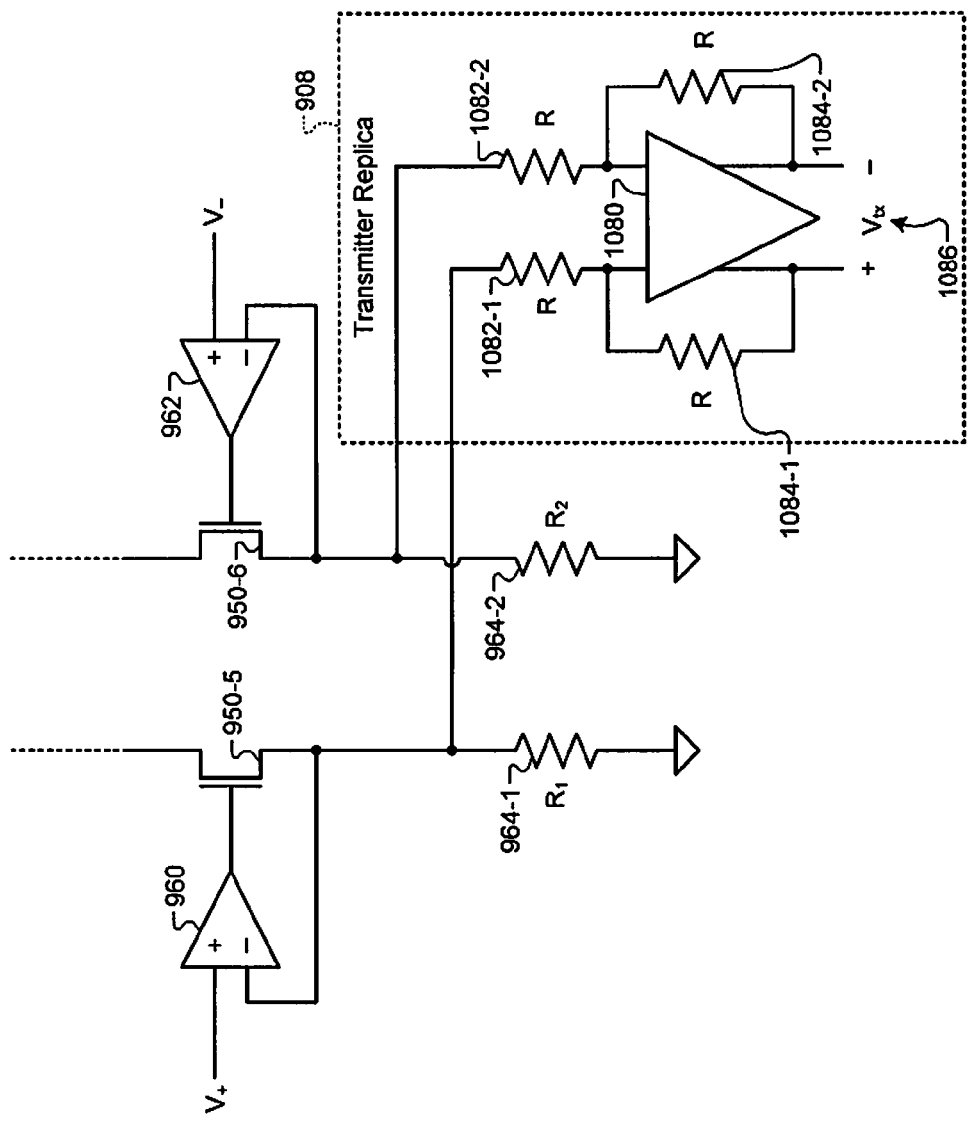
FIG. 25B is a functional schematic diagram of another exemplary transmitter replica according to the principles of the present disclosure.
Figure 25A:
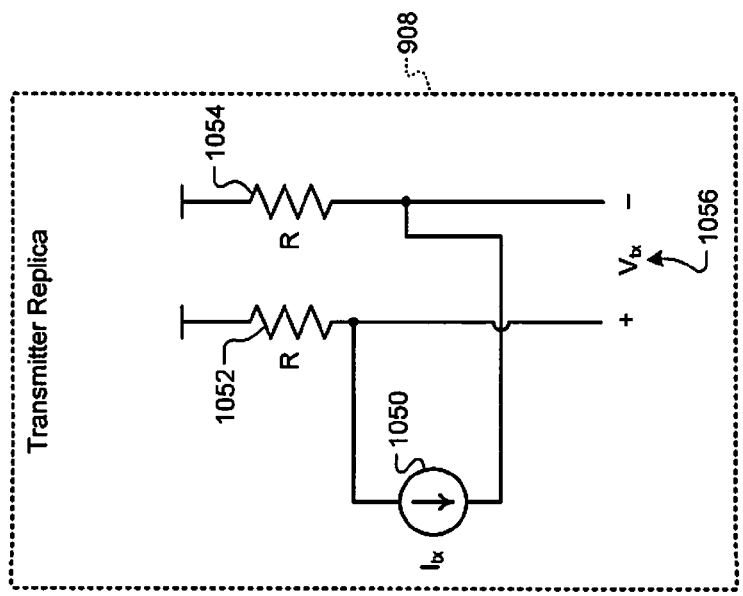
FIG. 25A is a functional schematic of a transmitter replica according to the principles of the present disclosure.

Referring now to FIG. 25A, a functional schematic of a transmitter replica, such as the transmitter replica 908 of FIG. 22A, according to the principles of the present disclosure is presented. A transmit current source $I_{tx}$ 1050 includes first and second terminals that communicate with first ends of first and second resistances 1052 and 1054, respectively. Second ends of the first and second resistances 1052 and 1054 communicate with a supply potential. A replica transmit voltage $V_{tx}$ 1056 is measured between the first ends of the first and second resistances 1052 and 1054.

The resistance value of the first and second resistances 1052 and 1054 may be equal or proportional to that of the termination resistances 940, 942, 944, and 946 of FIG. 23. The current provided by the current source $I_{tx}$ 1050 may be equal or inversely proportional to that sourced by the fifth and sixth transistors 950-5 and 950-6 of FIG. 23. In this way, an inversely proportional current is applied to proportional resistances, and the measured replica transmit voltage $V_{tx}$ 1056 should be approximately equal to the actual voltage transmitted through the transmission line.

Referring now to FIG. 25B, a functional schematic diagram of another exemplary transmitter replica according to the principles of the present disclosure is presented. The transmitter replica 908 includes an amplifier 1080 having first and second inputs and first and second outputs. First ends of first and second resistances 1082-1 and 1082-2 communicate with the inverting inputs of the first and second operational amplifiers 960 and 962 of FIG. 23, respectively.

Opposite ends of the first and second resistances 1082-1 and 1082-2 communicate with the first and second inputs of the amplifier 1080. Third and fourth resistances 1084-1 and 1084-2 communicate with the first and second inputs and the first and second outputs of the amplifier 1080, respectively. A replica transmit voltage $V_{tx}$ 1086 is measured between the first and second outputs of the amplifier 1080.

Those skilled in the art can now appreciate from the foregoing description that the broad teachings of the present disclosure can be implemented in a variety of forms. Therefore, while this disclosure has been described in connection with particular examples thereof, the true scope of the disclosure should not be so limited since other modifications will become apparent to the skilled practitioner upon a study of the drawings, the specification and the following claims.

What is claimed is:

1. A switching physical layer (PHY) device comprising:
a first termination network that communicates with a first network connector;
a switching transmitter that includes first and second outputs, which communicate with said first termination network and a second termination network, respectively, and that selectively outputs a transmit signal to a selected one of said first and second termination networks based on a control signal; and
a switching receiver that includes first and second inputs, which communicate with said first and second termination networks, respectively, and that receives a receive signal from said selected one of said first and second termination networks,
wherein said switching transmitter outputs a replica transmit signal based on said transmit signal to said switching receiver.

2. The switching PHY device of claim 1 further comprising first and second hybrids, wherein said first input of said switching receiver communicates with said first termination network via said first hybrid and said second input of said switching receiver communicates with said second termination network via said second hybrid.

3. A switching physical layer (PHY) device comprising:
a first termination network that communicates with a first network connector;
a switching transmitter that includes first and second outputs, which communicate with said first termination network and a second termination network, respectively, and that selectively outputs a transmit signal to a selected one of said first and second termination networks based on a control signal;
a switching receiver that includes first and second inputs, which communicate with said first and second termination networks, respectively, and that receives a receive signal from said selected one of said first and second termination networks; and
first and second hybrids, wherein said first input of said switching receiver communicates with said first termination network via said first hybrid and said second input of said switching receiver communicates with said second termination network via said second hybrid.

4. The switching PHY device of claim 1 wherein said switching receiver sums said replica transmit signal with said receive signal at a first summing node.

5. The switching PHY device of claim 4 further comprising:
an amplifier that includes an input, wherein said switching receiver sums said replica transmit signal with a second receive signal from a second one of said first and second termination networks at a second summing node; and
a switch module that connects one of said first summing node and said second summing node to said input of said amplifier based on said control signal.

6. The switching PHY device of claim 1 wherein said switching transmitter comprises:
a first cascode transistor that selectively passes said transmit signal to said first output based on said control signal; and
a second cascode transistor that selectively passes said transmit signal to said second output based on said control signal.

7. A laptop including the switching PHY device of claim 1.

8. A system comprising:
the laptop of claim 7; and
a docking station including a second network connector that communicates with said second termination network.

9. The system of claim 8 wherein said docking station includes said second termination network.

10. The system of claim 9 wherein said laptop includes a control module that generates said control signal to select said second termination network after said laptop is connected to said docking station.

11. The system of claim 10 wherein said control module generates said control signal to select said first termination network after said laptop is disconnected from said docking station.

12. An integrated circuit comprising the switching PHY device of claim 1.

13. The integrated circuit of claim 12 further comprising a media access control (MAC) device that communicates with said switching PHY device.

14. A switching physical layer (PHY) device comprising:
a first termination network that communicates with a first network connector;
a switch module that includes a terminal, that communicates with said first termination network and a second termination network, and that selectively connects a selected one of said first and second termination networks to said terminal based on a control signal;
a receiver that receives a receive signal from said terminal of said switch module; and
a transmitter that outputs a replica of a transmit signal to said receiver.

15. The switching PHY device of claim 14 further comprising:
a hybrid interposed between said receiver and said terminal of said switch module; and
a transmitter that outputs a transmit signal to said terminal of said switch module via said hybrid.

16. The switching PHY device of claim 14 further comprising:
a first hybrid interposed between said switch module and said first termination network;
a second hybrid interposed between said switch module and said second termination network;
a second switch module that includes a second terminal, that communicates with said first and second termination networks via said first and second hybrids, respectively, and that connects said selected one of said first and second termination networks to said second terminal; and
a transmitter that outputs a transmit signal to said second terminal of said second switch module.

17. The switching PHY device of claim 14 wherein said transmitter outputs said transmit signal to said terminal of said switch module.

18. The switching PHY device of claim 14 further comprising a second switch module that includes a second terminal, that communicates with said first termination network and said second termination network, and that connects said selected one of said first and second termination networks to said second terminal, wherein said transmitter outputs said transmit signal to said second terminal of said second switch module.

19. The switching PHY device of claim 14 wherein said receiver subtracts said replica of said transmit signal from said receive signal.

20. A laptop including the switching PHY device of claim 14.

21. A system comprising:
   the laptop of claim 20; and
   a docking station including a second network connector that communicates with said second termination network.

22. The system of claim 21 wherein said docking station includes said second termination network.

23. The system of claim 21 wherein said laptop includes a control module that generates said control signal to select said second termination network after said laptop is connected to said docking station.

24. The system of claim 23 wherein said control module generates said control signal to select said first termination network after said laptop is disconnected from said docking station.

25. An integrated circuit comprising the switching PHY device of claim 14.

26. The integrated circuit of claim 25 further comprising a media access control (MAC) device that communicates with said switching PHY device.

27. The switching PHY device of claim 3 wherein said first output of said switching transmitter communicates with said first termination network via said first hybrid and said second output of said switching transmitter communicates with said second termination network via said second hybrid.

28. A switching physical layer (PHY) device comprising:
   a first termination network that communicates with a first network connector;
   a switch module that includes a terminal, that communicates with said first termination network and a second termination network, and that selectively connects a selected one of said first and second termination networks to said terminal based on a control signal;
   a receiver that receives a receive signal from said terminal of said switch module;
   a hybrid interposed between said receiver and said terminal of said switch module; and
   a transmitter that outputs a transmit signal to said terminal of said switch module via said hybrid.

* * * * *